US005323124A

United States Patent [19]

Ikeda

[11] Patent Number: 5,323,124

[45] Date of Patent: Jun. 21, 1994

[54] AMPLIFIER INCLUDING CURRENT MIRROR CIRCUIT AND CURRENT GENERATOR

[75] Inventor: Masaharu Ikeda, Yokohama, Japan

[73] Assignee: Matsushita Electric Industrial Co., Ltd., Osaka, Japan

[21] Appl. No.: 963,752

[22] Filed: Oct. 20, 1992

[30] Foreign Application Priority Data

Oct. 21, 1991 [JP] Japan ................................ 3-272276

[51] Int. Cl.[5] ................................................ H03F 3/04

[52] U.S. Cl. ..................................... 330/288; 330/289

[58] Field of Search ............... 330/257, 288, 289, 256; 323/315, 316

[56] References Cited

U.S. PATENT DOCUMENTS 4,536,662 8/1985 Fujii ................................ 330/288 X
4,612,496 9/1986 Hines ................................ 330/288 X
5,179,357 1/1993 Perraud ................................ 330/288

FOREIGN PATENT DOCUMENTS 60-191508 9/1985 Japan .

*Primary Examiner*—Steven Mottola
*Attorney, Agent, or Firm*—Stevens, Davis, Miller & Mosher

[57] ABSTRACT

An amplifier is operated with a low power source voltage and has a reference voltage of 1.25 V or less. The temperature characteristic of the amplifier is controllable. The amplifier comprises substantially similar circuits and constants on its left and right sides under a condition that a voltage source is not connected to an input terminal, except that a diode-connected transistor is provided. Paying attention to the left-side circuit, the circuit which has the diode-coupled transistor having a forward voltage and resistors 22 and 23, is expressed by an equivalent circuit by the (Ho)-Thevenin theorem.

58 Claims, 6 Drawing Sheets

AMPLIFIER INCLUDING CURRENT MIRROR CIRCUIT AND CURRENT GENERATOR

CROSS-REFERENCE TO RELATED APPLICATION

This application relates to U.S. Ser. No. 07/963,700 filed Oct. 20, 1992 entitled "Voltage Generating Device", being filed by Masaharu Ikeda, and assigned the present assignee, based on Japanese Application No. 3-272274 filed Oct. 21, 1991 and the contents of which are incorporated herein by reference.

BACKGROUND OF THE INVENTION

1. Field of the Invention

The present invention relates to an amplifier which is operated with a low power supply voltage and which has a reference voltage which temperature characteristic can be controlled.

2. Description of the Prior Art

A of prior art amplifier having a reference voltage independent of temperature has been conventionally arranged as disclosed in JP-A-Ho 2-193410. The amplifier comprises a transistor, a resistor and two of first and second current sources. A positively varying voltage to a temperature is obtained by passing a current through the resistor, connected at its one end to an input terminal and connected at the other end to the first current source which is connected in series with a negatively varying base/emitter voltage of the transistor to the temperature obtained by passing a collector current through the transistor from the second current source to cancel these positively and negatively varying voltages each other and to thereby obtain a reference voltage (about 1.25 V) independent of temperature, whereby there is obtained a comparison amplifier which acts as if an amplifier having one input connected to the reference voltage.

Since the output terminal voltage of each of the current sources are set to correspond nearly to the diode forward voltage, when such a band gap current source as shown in JP-A-60-191508 is employed, the power source voltage can be lowered down to about 0.9 V.

Thus, the comparison amplifier can be driven with the power source voltage lower than the reference voltage.

The above will be explained in more detail by referring to FIG. 15. FIG. 15 shows an arrangement of a prior art amplifier which has an input terminal 2 to which a voltage from a voltage source 1 is applied and also has an output terminal 3. In the drawing, reference numeral 51 denotes a resistor, numerals 52 and 54 current sources, 53 a transistor.

The operation of the prior art will next be explained. In FIG. 15, an addition of a base potential Vb53 of the transistor 53 to a multiplication of a resistive value R51 of the resistor 51 and a current Ics of the current source 52 corresponds to a voltage V1 of the voltage source 1 which is expressed by the following equation (1).

$$V1 = Vb53 + (R51 \times Ics) \quad (1)$$

When the voltage Vl of the voltage source 1 is small, the base voltage Vb53 of transistor 53 becomes also small and the collector current Ic53 of transistor 53 becomes smaller than a current I54 of the current source 54. Thus, this causes a tendency of current to be discharged from the output terminal 3, so that the output voltage V3 becomes high. On the other hand, when the voltage V1 is large, the base voltage Vb53 of transistor 53 becomes also large and the collector current Ic53 of transistor 53 becomes larger than the current I54 of the current source 54. This causes a tendency of a current to be absorbed into the output terminal 3, so that the voltage V3 becomes low.

This operation is equivalent to the operation of the amplifier when an inverted input is connected to the input terminal 2, the reference voltage is connected to a non-inverted input, and an output is connected to the output terminal 3. The magnitude of the reference voltage can be found in the following manner. That is, when the voltage V1 of the input terminal 2 becomes equal to the reference voltage, no current flows into and out of the output terminal 3. When such a voltage V1 condition is found, the value of the reference voltage can be known.

First, since no current flows into and out of the output terminal 3, the following equation (2) is satisfied.

$$Ic53 = I54 \quad (2)$$

where, Ic53 denotes the collector current of the transistor 53 and I54 denotes the current of the current source 54.

At this time, the base potential Vb53 of the transistor 53 is expressed as follows.

$$Vb53 = k \times T/q \times ln(I54/Is) \quad (3)$$

where, k: Boltzmann factor

T: Absolute temperature q: Electric charge for an electron

Is: The backward saturation current of the transistor

Meanwhile, the current source 52 is such a band gap current source as shown in JP-A-60-191508 and the current value Ics of the current source is determined by the following equation (4).

$$Ics = (k \times T/q) \times ln(N)/Rcs \quad (4)$$

where, N denotes a constant and Rcs denotes a current setting resistance.

Accordingly, the voltage V1 of the input terminal 2 under such a condition is expressed by the following equation 5) with use of the equations (1), (2) and (4) and the value V1' becomes the reference voltage of the prior art amplifier.

$$V1' = Vb53 + (k \times T/q) \times ln(N) \times R51/Rcs \quad (5)$$

The first term in the equation 5) indicates the diode forward voltage and it is well known that the value of the diode forward voltage is about 650 mV and varies with temperature at a rate of −2 mV/deg.

Hence, when a change to temperature in the second term of the equation 5) is set to have such a value that is opposite in polarity to and is equal in magnitude to the first term, voltage changes to temperature in the first and second terms can be canceled each other. Thus, the reference voltage V1' can be eventually independent of temperature.

First, when a voltage change to temperature is found by differentiating the second term with respect to absolute temperature T and the differentiated voltage change is set to be equal to +2 mV the following equation (6) is obtained.

$$d[\text{equation (5), second term}]/dT = (k/g) \times \ln(N) \times R51/Rcs = +2\text{ mV} \quad (6)$$

Substituting the equation (6) into the second term of the equation 5) and setting T=300° K. results in an equation (7) which follows.

$$[\text{equation (5), second term}] = d[\text{equation (5), second term}]/dT \times T = +2\text{ mV} \times 300^\circ\text{ K} = 600\text{ mV} \quad (7)$$

Hence, when the respective constants are set so that $\{(k \times T/q) \times \ln(N) \times \mathbf{R51}/Rcs\}$ or $(\mathbf{R51} \times Ics)$ is 600 mV, the reference voltage V1' becomes about 1.25 V according to the equation 5) and thus can be eventually set to be independent of temperature.

Further, the base potential of the transistor 53 as the terminal voltage of the current source 52 corresponds to the diode forward voltage and the terminal voltage of the current source 5 is determined by a load connected to the output terminal 3. However, when the base of such a common-emitter transistor as the transistor 53 is connected to the output terminal 3, the base potential becomes the diode forward voltage. Thus, when the current sources are realized with such an arrangement as shown in JP-A-60-191508, the power source voltage can be lowered to about 0.9 V. Accordingly, the amplifier can be driven with a power source voltage lower than the reference voltage.

In this way, in the prior art amplifier, a reference voltage (about 1.25 V) independent of temperature can be obtained and the power source voltage of the amplifier can be lowered to about 0.9 V.

However, the prior art amplifier has had a first problem that the amplifier requires two current sources, which results in that the necessary circuit area becomes large.

A second problem in the prior art amplifier has been that the reference voltage is fixed at about 1.25 V so that, when it is desired to set a large reference voltage, this is realized by providing a resistor voltage-division means to the input terminal of the amplifier; whereas, when it is desired to set a small reference voltage, this is difficult because the value of the second term of the equation 5) must be made small while undesirably admitting its temperature dependency. That is, the reference voltage value and the temperature characteristic cannot be controlled independently of each other.

SUMMARY OF THE INVENTION

It is an object of the first embodiment of the invention to provide an excellent amplifier which solves the first problem in the prior art and which as a single current source.

A second object of the second to twelfth embodiments of the invention is to provide an excellent amplifier which can solve the second problem in the prior art and in which a temperature characteristic can be controlled and a reference voltage can be lowered to 1.25 V or less.

In order to attain the first object of the first embodiment, a resistor is connected to an input of a current mirror circuit and a current generating means is connected to an output of the current mirror circuit. For attaining the second object of the second embodiment, current generating means and resistor voltage-division means are connected to the input and output of the current mirror circuit respectively, and another current generating means is connected to an output of each of the resistor voltage-division means.

For attaining the second object of the third embodiment, current generating means and resistor voltage-division means are connected to an input of a current mirror circuit, and another current generating means is connected to an output of the resistor voltage-division means so that a current comparing means compares output currents of two voltage/current converting means.

In order to attain the second object of the fourth embodiment, a current generating means is connected to each of the input and output of a current mirror circuit, a resistor is connected to the input of the current mirror circuit, a resistor voltage-division means is connected to the output of the current mirror circuit, and another current generating means is connected to an output of the resistor voltage-division means.

For attain the second object of the fifth embodiment, a current generating means is connected to each of the input and output of a current mirror circuit, a resistor is connected to the output of the current mirror circuit, a resistor voltage-division means is connected to the input of the current mirror circuit, and another current generating means is connected to an output of the resistor voltage-division means.

The second object of the sixth embodiment is attained by connecting a current generating means and a resistor voltage-division means respectively to the input and output of a current mirror circuit.

In order to attain the second object of the seventh embodiment, a current generating means and a resistor voltage-division means are connected to an input of a current mirror circuit so that a current comparing means compares output currents of two voltage/current converting means.

For attaining the second object of the eighth embodiment, a current generating means is connected to each of the input and output of a current mirror circuit, a resistor is connected to the input of the current mirror circuit, and a resistor voltage-division means is connected to the output of the current mirror circuit.

In order to attain the second object of the ninth embodiment, a current generating means is connected to each of the input and output of a current mirror circuit, a resistor is connected to the output of the current mirror circuit, and a resistor voltage-division means is connected to the input of the current mirror circuit.

The second object of the tenth embodiment is attained by connecting a resistor voltage-division means to each of the input and output of a current mirror circuit, and by connecting current generating means to outputs of the respective resistor voltage-division means.

For attaining the second object of the eleventh embodiment, a resistor voltage-division means is connected to an input of a current mirror circuit, and a current generating means is connected to the resistor voltage-division means so that a current comparing means compares output currents of two voltage/current converting means.

In order to ,attain the second object of the twelfth embodiment, a resistor is connected to an input of a current mirror circuit, a resistor voltage-division means is connected to an output of the current mirror circuit, and a current generating means is connected to an output of the resistor voltage-division means.

The second object of the thirteenth embodiment is attained by connecting a resistor to an output of a current mirror circuit, by connecting a resistor voltage-division means to an input of the current mirror circuit, and further by connecting a current generating means to an output of the resistor voltage-division means.

Therefore, in accordance with the first embodiment, the reference voltage is obtained by adding a negatively varying voltage (to temperature) of the diode forward voltage of the diode-connected transistor at the input of the current mirror circuit to a positively varying voltage (to temperature) of input current times resistance obtained when the output current of the current mirror circuit is equal to the current of the current generating means, so that the temperature characteristic can be advantageously controlled by changing a ratio between these varying voltages. Further, when the output terminal voltage is set to be below 0.7 V and such a low-voltage operated type current generating means as shown in JP-A-60-191508 is employed, the power source voltage of the amplifier can be advantageously lowered to about 0.9 V.

In accordance with the second embodiment, the resistor voltage-division means and the two current generating means are provided to each of the input and output of the current mirror circuit so that the amplifier comprises the similar circuits which are the same and similar in the voltages and currents of the corresponding elements. When the first and second input terminal voltages are equal to each other, the both circuits are similar so that the output current of the current mirror circuit is equal to the current of the current generating means provided at its junction point so that the input voltage becomes equal to the reference voltage. When the voltage at the output of the resistor voltage-division means at the input of the current mirror circuit connected to the input terminal is changed, the similar condition of the both circuits is destroyed and the balance between the output current of the current mirror circuit and the current of the current generating means at its junction point is destroyed, so that a current or voltage corresponding to a variation in the current or voltage at the input terminal appears at the output terminal.

The reference voltage is equivalently obtained by adding a negatively varying forward voltage (to temperature) of the diode-connected transistor provided at the input of the current mirror circuit through which the current of the current generating means flows, to a positively varying voltage (to temperature) obtained through the current generating means and resistor voltage-division means; and further by multiplying the obtained addition by the voltage division ratio of the resistor voltage-division means. Thus, by changing the ratio of these varying voltages, the temperature characteristic can be advantageously controlled.

When the reference voltage and the output terminal voltage are set to be 0.7 V or less and such a low-voltage operated type current generating means as shown in JP-A-60-191508 is employed, the power source voltage can be advantageously lowered to about 0.9 V.

In accordance with the third embodiment, the resistor voltage-division means and the two current generating means are connected to the input of the current mirror circuit, and the voltage/current converting means forms the similar circuits which are the same and similar in the voltage and current of the corresponding elements. When the first and second input terminal voltages are equal to each other, the both circuits are put in their similar condition, in which the output currents of the current mirror circuits become equal and the output of the current comparing means becomes zero. When the voltage at the output of the resistor voltage-division means provided at the input of the current mirror circuit connected to one input terminal is changed and the similar condition between the both circuits is destroyed, a current or voltage corresponding to a variation in the current or voltage at the input terminal appears at the output terminal.

The reference voltage is equivalently obtained by adding a negatively varying forward voltage (to temperature) of the diode-connected transistor provided at the input of the current mirror circuit through which the current of the current generating means flows, to a positively varying voltage (to temperature) obtained through the current generating means and resistor voltage-division means; and further by multiplying the obtained addition by the voltage division ratio of the resistor voltage-division means. Thus, the reference voltage can be set to be less than 1.25 V. Further, by changing the ratio of these varying voltages, the temperature characteristic can be advantageously controlled.

When the reference voltage and the output terminal voltage are set to be 0.7 V or less, such a low-voltage operated type current generating means as shown in JP-A-60-191508 is employed, and the current comparing means is formed to have a current mirror structure; the power source voltage can be advantageously lowered to about 0.9 V.

The fourth embodiment corresponds in arrangement to the second invention but with one current generating means provided at the input side of the current mirror circuit and the resistor provided at the ground side of the resistor voltage-division means being removed. When the input voltage is equal to the reference voltage, the fourth embodiment comprises similar circuits which are the same and similar in the voltage and current of the corresponding elements. When the first and second input terminal voltages are equal to each other, the both circuits are put in their similar condition so that the input voltage is equal to the reference voltage. When the voltage at the output of the resistor voltage-division means provided at the input of the current mirror circuit connected to one input terminal is changed and the similar condition between the both circuits is destroyed, and the balance between the output current of the current mirror circuit and the current of the current generating means at its junction point is destroyed, so that a current or voltage corresponding to a variation in the current or voltage at the input terminal appears at the output terminal.

The reference voltage is equivalently obtained by adding a negatively varying forward voltage (to temperature) of the diode-connected transistor provided at the input of the current mirror circuit through which the current of the current generating means flows, to a positively varying voltage (to temperature) obtained through the current generating means and resistor voltage-division means; and further by multiplying the obtained addition by the voltage division ratio of the resistor voltage-division means. Thus, the reference voltage can be set to be less than 1.25 V. Further, by changing the ratio of these varying voltages, the temperature characteristic can be advantageously controlled.

When the reference voltage and the output terminal voltage are set to be 0.7 V or less, such a low-voltage operated type current generating means as shown in JP-A-60-191508 is employed, the power source voltage can be advantageously lowered to about 0.9 V.

Further, since the number of necessary current generating means is decreased, the fourth embodiment can be economically arranged advantageously.

The fifth embodiment corresponds in arrangement to the second invention but with one current generating means provided at the output side of the current mirror circuit and the resistor provided at the ground side of the resistor voltage-division means being removed. When the input voltage is equal to the reference voltage, the fifth embodiment comprises the similar circuits which are the same and similar in the voltage and current of the corresponding elements. When the first and second input terminal voltages are equal to each other, both circuits are put in their similar condition so that the input voltage is equal to the reference voltage. When the voltage at the output of the resistor voltage-division means provided at the input of the current mirror circuit connected to one input terminal is changed and the similar condition between the both circuits is destroyed, and the balance between the output current of the current mirror circuit and the current of the current generating means at its junction point is destroyed, so that a current or voltage corresponding to a variation in the current or voltage at the input terminal appears at the output terminal.

The reference voltage is equivalently obtained by adding a negatively varying forward voltage (to temperature) of the diode-connected transistor provided at the input of the current mirror circuit through which the current of the current generating means flows, to a positively varying voltage (to temperature) obtained through the current generating means and resistor voltage-division means; and further by multiplying the obtained addition by the voltage division ratio of the resistor voltage-division means. Thus, the reference voltage can be set to be 1.25 V or less. Further, by changing the ratio of these varying voltages, the temperature characteristic can be advantageously controlled.

When the reference voltage and the output terminal voltage are set to be 0.7 V or less, such a low-voltage operated type current generating means as shown in JP-A-60-191508 is employed, the power source voltage can be advantageously lowered to about 0.9 V.

Further, since the number of necessary current generating means is decreased, the fifth embodiment can be economically arranged advantageously.

In accordance with the sixth embodiment, the resistor voltage-division means and the current generating means are provided to each of the input and output of the current mirror circuit and the sixth embodiment comprises the similar circuits which are the same and similar in the voltage and current of the corresponding elements. When the first and second input terminal voltages are equal to each other, the both circuits are put in their similar condition, in which the output current of the current mirror circuit becomes equal to the current of the current generating means provided at its junction point, whereby the input voltage becomes equal to the reference voltage. When the output voltage through the resistance voltage division at the input of the current mirror circuit connected to the input terminal is changed and the similar condition between the both circuits is destroyed, the balance between the output current of the current mirror circuit and the current of the current generating means at its junction point is destroyed, a current or voltage corresponding to a variation in the current or voltage at the input terminal appears at the output terminal.

The reference voltage corresponds equivalently to a multiplication of the forward voltage of the diode-connected transistor provided at the input of the current mirror circuit obtained through passage of the current of the current generating means by the voltage division ratio of the resistor voltage-division means. Thus a negatively varying reference voltage to temperature can be obtained and further since the number of necessary current generating means is decreased, the sixth embodiment can be economically arranged advantageously.

When the reference voltage and the output terminal voltage are set to be 0.7 V or less and such a low-voltage operated type current generating means as shown in JP-A-60-191508 is employed, the power source voltage can be advantageously lowered to about 0.9 V.

In accordance with the seventh embodiment, the resistor voltage-division means and the current generating means are connected to the input of the current mirror circuit, and the voltage/current converting means forms the similar circuits which are the same and similar in the voltage and current of the corresponding elements. When the first and second input terminal voltages are equal to each other, the both circuits are put in similar condition, in which the output currents of the current mirror circuits become equal and the output of the current comparing means becomes zero. When the output voltage of the resistor voltage-division means provided at the input of the current mirror circuit connected to one input terminal is changed and the similar condition between the both circuits is destroyed, a current or voltage corresponding to a variation in the current or voltage at the input terminal appears at the output terminal.

The reference voltage is equivalently obtained by multiplying the forward voltage of the diode-connected transistor provided at the input of the current mirror circuit obtained through passage of the current of the current generating means by the voltage division ratio of the resistor voltage-division means. Thus, a negatively varying reference voltage to temperature can be obtained. Further, since the number of necessary current generating means is reduced, the seventh embodiment can be economically arranged advantageously.

When the reference voltage and the output terminal voltage are set to be 0.7 V or less, such a low-voltage operated type current generating means as shown in JP-A-60-191508 is employed, and the current comparing means is formed to have a current mirror structure; the power source voltage can be advantageously lowered to about 0.9 V.

The eighth embodiment corresponds in arrangement to the sixth invention but with the resistor at the ground side of the resistor voltage-division means provided at the input side of the current mirror circuit and the resistor provided at the ground side of the resistor voltage-division means being removed. When the input voltage is equal to the reference voltage, the fourth invention comprise the similar circuits which are the same and similar in the voltage and current of the corresponding elements. When the first and second input terminal voltages are equal to each other, the both circuits are put in their similar condition so that the input voltage is equal to the reference voltage. When the voltage at the output of the resistor voltage-division means provided at the input of the current mirror circuit connected to one input terminal is changed and the similar condition between the both circuits is destroyed, and the balance between the output current of the current mirror circuit and the current of the current generating means at its junction point is destroyed, so that a current or voltage corresponding to a variation in the current or voltage at the input terminal appears at the output terminal.

The reference voltage is equivalently obtained by multiplying the forward voltage obtained through passage of the current of the current generating means through the diode-connected transistor provided at the input of the current mirror circuit by the voltage division ratio of the resistor voltage-division means. Thus, a negatively varying reference voltage to temperature can be obtained. Further, since the number of necessary current generating means is reduced, the eighth embodiment can be economically arranged advantageously.

When the reference voltage and the output terminal voltage are set to be 0.7 V or less, such a low-voltage operated type current generating means as shown in JP-A-60-191508 is employed, the power source voltage can be advantageously lowered to about 0.9 V.

The ninth embodiment corresponds in arrangement to the sixth invention but with the resistor at the ground side of the resistor voltage-division means provided at the input side of the current mirror circuit and the resistor provided at the ground side of the resistor voltage-division means being removed. When the input voltage is equal to the reference voltage, the fourth embodiment comprise the similar circuits which are the same and similar in the voltage and current of the corresponding elements. When the first and second input terminal voltages are equal to each other, the both circuits are put in their similar condition so that the input voltage is equal to the reference voltage. When the voltage at the output of the resistor voltage-division means provided at the input of the current mirror circuit connected to one input terminal is changed and the similar condition between the both circuits is destroyed, and the balance between the output current of the current mirror circuit and the current of the current generating means at its junction point is destroyed, so that a current or voltage corresponding to a variation in the current or voltage at the input terminal appears at the output terminal.

The reference voltage is equivalently obtained by multiplying the forward voltage obtained through passage of the current of the current generating means through the diode-connected transistor provided at the input of the current mirror circuit by the voltage division ratio of the resistor voltage-division means. Thus, a negatively varying reference voltage to temperature can be obtained. Further, since the number of necessary current generating means is reduced, the eighth embodiment can be economically arranged advantageously.

When the reference voltage and the output terminal voltage are set to be 0.7 V or less, such a low-voltage operated type current generating means as shown in JP-A-60-191508 is employed, the power source voltage can be advantageously lowered to about 0.9 V.

In accordance with the tenth embodiment, the resistor voltage-division means and the current generating means are provided to each of the input and output of the current mirror circuit. The tenth embodiment comprises the similar circuits which are the same and similar in the voltage and current of the corresponding elements. When the first and second input terminal voltages are equal to each other, the both circuits are put in their similar condition so that the input voltage is equal to the reference voltage. When the voltage at the output of the resistor voltage-division means provided at the input of the current mirror circuit connected to one input terminal is changed and the similar condition between the both circuits is destroyed, and the balance between the output current of the current mirror circuit and the current of the current generating means at its junction point is destroyed, so that a current or voltage corresponding to a variation in the current or voltage at the input terminal appears at the output terminal.

The reference voltage is equivalently obtained by adding a negatively varying forward voltage (to temperature) of the diode-connected transistor provided at the input of the current mirror circuit through which the current of the current generating means flows, to a positively varying voltage (to temperature) obtained through the current generating means and resistor voltage-division means; and further by multiplying the obtained addition by the voltage division ratio of the resistor voltage-division means. Thus, the reference voltage can be set to be 1.25 V or less. Further, by changing the ratio of these varying voltages, the temperature characteristic can be advantageously controlled.

The reference voltage settable in the tenth embodiment is limited to more than diode forward voltage, but since the number of necessary current generating means is reduced, the tenth embodiment can be economically arranged advantageously.

When such a low-voltage operated type current generating means as shown in JP-A-60-191508 is employed, the power source voltage can be advantageously lowered to the reference voltage of +0.2 V.

Further, since the number of necessary current generating means is decreased, the tenth embodiment can be economically arranged advantageously.

In accordance with the eleventh embodiment, the resistor voltage-division means and the current generating means are connected to the input of the current mirror circuit, and the voltage/current converting means forms the similar circuits which are the same and similar in the voltage and current of the corresponding elements. When the first and second input terminal voltages are equal to each other, the both circuits are put in their similar condition, in which the output currents of the current mirror circuits become equal and the output of the current comparing means becomes zero. When the voltage at the output of the resistor voltage-division means provided at the input of the current mirror circuit connected to one input terminal is changed and the similar condition between the both circuits is destroyed, a current or voltage corresponding to a variation in the current or voltage at the input terminal appears at the output terminal.

The reference voltage is equivalently obtained by adding a negatively varying forward voltage (to temperature) of the diode-connected transistor provided at the input of the current mirror circuit through which the current of the current generating means flows, to a positively varying voltage (to temperature) obtained through the current generating means and resistor voltage-division means; and further by multiplying the obtained addition by the voltage division ratio of the resistor voltage-division means. Thus, the reference voltage can be set to be less than 1.25 V. Further, by changing the ratio of these varying voltages, the temperature characteristic can be advantageously controlled.

The reference voltage settable in the eleventh embodiment is limited to more than diode forward voltage, but since the number of necessary current generating means is reduced, the eleventh embodiment can be economically arranged advantageously.

When such a low-voltage operated type current generating means as shown in JP-A-60-191508 is employed and the current comparing means is made to have a current mirror type, the power source voltage can be advantageously lowered to the reference voltage of +0.2 V.

The twelfth embodiment corresponds in arrangement to the tenth embodiment but with current generating means provided at the input side of the current mirror circuit and the resistor provided at the ground side of the resistor voltage-division means being removed. When the input voltage is equal to the reference voltage, the twelfth embodiment comprises the similar circuits which are the same and similar in the voltage and current of the corresponding elements. When the first and second input terminal voltages are equal to each other, the both circuits are put in their similar condition so that the input voltage is equal to the reference voltage. When the voltage at the output of the resistor voltage-division means provided at the input of the current mirror circuit connected to one input terminal is changed and the similar condition between the both circuits is destroyed, and the balance between the output current of the current mirror circuit and the current of the current generating means at its junction point is destroyed, so that a current or voltage corresponding to a variation in the current or voltage at the input terminal appears at the output terminal.

The reference voltage is equivalently obtained by adding a negatively varying forward voltage (to temperature) of the diode-connected transistor provided at the input of the current mirror circuit through which the current of the current generating means flows, to a positively varying voltage (to temperature) obtained through the current generating means and resistor voltage-division means; and further by multiplying the obtained addition by the voltage division ratio of the resistor voltage-division means. Thus, the reference voltage can be set to be less than 1.25 V. Further, by changing the ratio of these varying voltages, the temperature characteristic can be advantageously controlled.

The reference voltage settable in the eleventh embodiment is limited to more than diode forward voltage, but since the number of necessary current generating means is reduced, the eleventh embodiment can be economically arranged advantageously.

When such a low-voltage operated type current generating means as shown in JP-A-60-191508 is employed and the current comparing means is made to have a current mirror type, the power source voltage can be advantageously lowered to the reference voltage of +0.2 V.

The thirteenth embodiment corresponds in arrangement to the tenth embodiment but with current generating means provided at the output side of the current mirror circuit and the resistor provided at the ground side of the resistor voltage-division means being removed. When the input voltage is equal to the reference voltage, the thirteen embodiment comprises the similar circuits which are the same and similar in the voltage and current of the corresponding elements. When the first and second input terminal voltages are equal to each other, the both circuits are put in their similar condition so that the input voltage is equal to the reference voltage. When the voltage at the output of the resistor voltage-division means provided at the input of the current mirror circuit connected to one input terminal is changed and the similar condition between the both circuits is destroyed, and the balance between the output current of the current mirror circuit and the current of the current generating means at its junction point is destroyed, so that a current or voltage corresponding to a variation in the current or voltage at the input terminal appears at the output terminal.

The reference voltage is equivalently obtained by adding a negatively varying forward voltage (to temperature) of the diode-connected transistor provided at the input of the current mirror circuit through which the current of the current generating means flows, to a positively varying voltage (to temperature) obtained through the current generating means and resistor voltage-division means; and further by multiplying the obtained addition by the voltage division ratio of the resistor voltage-division means. Thus, the reference voltage can be set to be less than 1.25 V. Further, by changing the ratio of these varying voltages, the temperature characteristic can be advantageously controlled.

The reference voltage settable in the eleventh embodiment is limited to more than diode forward voltage, but since the number of necessary current generating means is reduced, the eleventh embodiment can be economically arranged advantageously.

When such a low-voltage operated type current generating means as shown in JP-A-60-191508 is employed and the current comparing means is made to have a current mirror type, the power source voltage can be advantageously lowered to the reference voltage of +0.2 V.

DESCRIPTION OF THE PREFERRED EMBODIMENTS

Figure 1A:
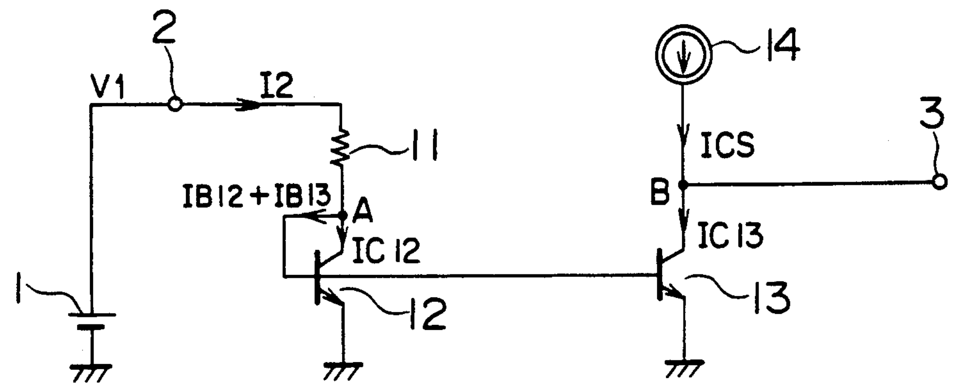
FIG. 1A is an arrangement of an amplifier in accordance with a first aspect of the first embodiment.

Referring to FIG. 1A, there is shown an arrangement of an amplifier in accordance with a first aspect of the first embodiment, in which a reference voltage is set to be independent of temperature. In FIG. 1A, the amplifier has an input terminal 2 to which a voltage is applied from a voltage source 1 and also has an output terminal 3. Reference numeral 11 denotes a resistor, and numeral 14 denotes a current source. Transistors 12 and 13 form a current mirror circuit.

Explanation will next be made as to the operation of the first aspect of the first embodiment. In FIG. 1A, when a current I2 flows from the input terminal 2, a voltage V1 at the input terminal 2 corresponds to an addition of a base potential Vb12 of the transistor 12 and a multiplication of a resistance R11 of the resistor 11 and the current I2 and is expressed by the following equation (8).

$$V1 = Vb12 + (R11 \times I2) \quad (8)$$

The current I2 is divided into a collector current Ic12 and a base current (Ib12+Ib13) at a junction point A of the resistor 11 and the base and collector of the transistor 12. Since a current amplification factor hfe of the transistor is very large, the base current (Ib12+Ib13) is considered negligible. Further, the collector currents Ic12 and Ic 13 are equal to each other because the transistors 12 and 13 form the current mirror circuit. Accordingly, the following equations (9) and (10) are obtained.

$$I2 = Ic12 + (Ib12 + Ib13) \quad (9)$$

$$\therefore I2 \approx Ic12 = Ic13 \quad 10)$$

When the voltage Vi is small, the input current Ic12 of the current mirror circuit is small and the output current Ic13 of the current mirror circuit is also small. Thus, since the collector current Ic13 of the transistor 13 is smaller than an current value Ics of the current source 14, an output voltage V3 at the output terminal 3 becomes such a high potential that causes the current to be discharged from the output terminal. When the voltage V1 is large, the collector current Ic13 of the transistor 13 is inversely larger than the current value Ics of the current source 14, which results in that the output voltage V3 becomes such a low potential that causes the current to be absorbed into the output terminal.

This operation is equivalent to the operation of an amplifier in which an inverted input is applied to the input terminal 2, a reference voltage is connected to a non-inverted input, and the output terminal 3 is connected to an output. The magnitude of this reference voltage can be found in the following manner. That is, when the voltage V1 at the input terminal 2 becomes equal to the reference voltage, the discharging and absorbing operation of the current at the output terminal 3 disappears. Thus, the value of the reference voltage can be known by finding such a V1 condition.

First, an equation (11) is obtained from the condition that no discharging and absorbing operation of the flow from and in the output terminal 3 and also from the equation (10).

$$I14 = Ic13 = I12 \approx I2 \quad (11)$$

Hence, the base potential Vb12 of the transistor 12 can be expressed by an equation (12) which follows.

$$Vb12 = k \times T/q \times ln(I2/Is) \quad (12)$$

The current source 14 is such a band gap current source as disclosed in JP-A-60-191508 and the current value Ics of the current source 14 is determined by the equation (4).

Accordingly, the voltage V1 at the input terminal 2 under such a condition is expressed by the following equation (13) with use of the equations (8) and (11). The value V1' of the equation (13) corresponds to the reference voltage of the amplifier.

$$V1' = Vb12 + (k \times T/q) \times ln(N) \times R11/Rcs \quad (13)$$

It is well known that the first term in the equation (13) indicates the diode forward voltage, the value of the first term is about 650 mV and vary with temperature at a rate of −2 mV/deg.

Thus, when a variation in the second term of the equation (13) to temperature is set to be equal in magnitude to and to be opposite in polarity to the first term, voltage variations in the first and second terms to temperature can be canceled. Therefore, the reference voltage V1' can be eventually made independent of temperature.

When the second term is differentiated with respect to absolute temperature T to find a voltage variation to temperature and the voltage variation is set to be +2 mV, the following equation (14) is satisfied.

$$d[\text{second term of equation } (13)]/dt = (k/q) \times ln(N) \times R51/Rcs = +2mV \quad (14)$$

Substituting the equation (14) into the second term of the equation (13) and setting T=300° K. results in an equation (15) which follows.

$$[\text{equation (13), second term}] = d[\text{equation (13), second term}]/dT \times T = +2 \text{ mV} \times 300° \text{ K} = 600 \text{ mV} \quad (15)$$

Hence, when the respective constants are set so that (k×T/q)×ln(N)×R11/Rcs or R11×Ics is equal to 600 mV, the reference voltage V1' becomes about 1.25 V in accordance with the equation (13) and eventually the temperature-independent voltage can be set.

A terminal voltage of the current source 14 is determined by a load connected to the output terminal 3. However, when the base of such a common-emitter transistor as the transistor 13 is connected to the output terminal 3, the terminal voltage becomes the diode forward voltage. Therefore, when the current source 14 is realized with such an arrangement as described in JP-A-60-191508, the power supply voltage can be lowered to about 0.9 V. Thus, the amplifier can be driven with the power supply voltage lower than the reference voltage.

Since it is seen from the equation (13) that the reference voltage is expressed in terms of a ratio between the resistive value R11 and the resistance Rcs for setting of the current of the current source 14 and is independent of the absolute value of the resistive value, the amplifier circuit can be easily arranged.

In this way, the first aspect of the first embodiment has an advantage that, since the reference voltage V1' given by the equation (13) can be expressed in the form of an addition of the forward voltage of the diode-connected transistor 12 to the voltage corresponding in magnitude to the resistance 11 multiplied by the temperature-independent coefficients including the absolute temperature T obtained from the current value Ics of the current source 14 and the resistance ratio, when a ratio between these voltages is changed, the temperature characteristic can be controlled and the amplifier can be arranged with the current source reduced by one in the number of current sources necessary in the prior art.

Further, since the terminal voltage of the current source 14 is arranged to correspond to the diode forward direction, when such a low-voltage operated type current source as shown in JP-A-60-191508 is employed, the power source voltage can be lowered down to about 0.9 V.

Further, since the value of the resistor 13 associated with the reference voltage and the value of the current setting resistor Rcs are given in the form of a ratio in the equation (13), the amplifier can be easily and effectively made in the form of a semiconductor integrated circuit independently of the accuracy of the absolute value.

Figure 1B:
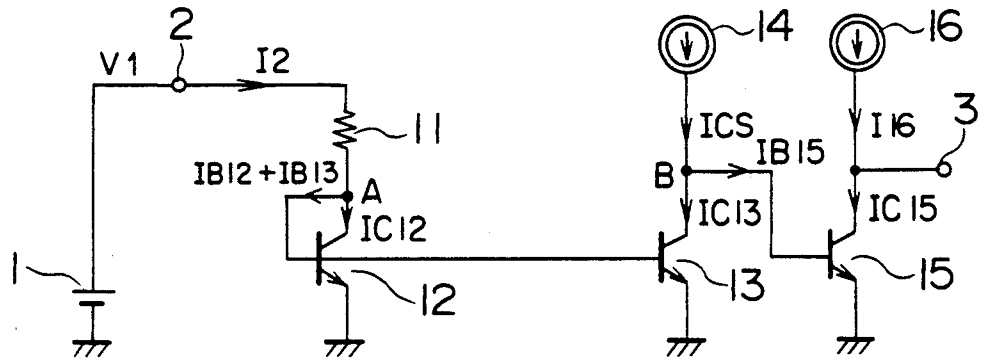
FIG. 1B is an arrangement of an amplifier in accordance with a second aspect of the first embodiment.

Shown in FIG. 1B is an arrangement of an amplifier in accordance with a second aspect of the first embodiment.

FIG. 1B corresponds to the arrangement of FIG. 1A, but a transistor 15 and a current source 16 are provided between the output terminal 3 and the junction point B between the current source 14 and the collector of the transistor 13.

Explanation will next be made as to the operation of the arrangement in FIG. 1B, when the voltage V1 is small, the collector current Ic12 of the transistor 12 as the input current of the current mirror circuit is also small and the collector current Ic13 of the transistor 13 as the output current of the current mirror circuit is also small. This causes the collector current Ic13 of the transistor 13 to be smaller than the current value Ics of the current source 14 so that the base current Ib15 of the transistor 15 increases and a collector current Ic15 thereof also increases. Since the collector current Ic15 is larger than the current I16 of the current source 16, a current tends to flow into the output terminal 3, whereby the output voltage V3 at the output terminal 3 becomes a low potential. On the other hand, when the voltage V1 is large, the collector current Ic13 of the transistor 13 is larger than the current value Ics of the current source 14 so that the base current Ib15 of the transistor 15 decreases and the collector current 15 thereof also decreases. This causes the collector current Ic15 to be smaller than the current I16 of the current source 16, whereby a current tends to flow out of the output terminal 3 and the output voltage V3 becomes a high potential.

The operation of the arrangement of FIG. 1B is substantially the same as that of FIG. 1A, except that the output polarity is different from that of FIG. 1A. That is, this operation is equivalent to the operation of an amplifier wherein a non-inverted input is applied to the input terminal 2, a reference voltage is connected to an inverted input, and an output is connected to the output terminal 3.

Accordingly, the reference voltage can be also found by the same manner as in the first embodiment of the first invention.

First, since no current flows into and out of the output terminal, the following equation (16) is satisfied.

$$I16 = Ic15 \tag{16}$$

In this case, the currents Ics, Ic13 and Ib15 flowing into and out of the junction point B between the current source 14 and the collector and base of the transistor 13 can be expressed as follows.

$$Ics = Ic13 + Ib15 \tag{17}$$

Assume now that the current I16 of the current source 16 is set to be twice the current value Ics of the current source 14. Then the equation (17) is modified with use of the equation (16), as the following equation (18).

$$Ics = Ic11 + (2 \times Ics/hfe) \tag{18}$$

Where, symbol hfe denotes the current amplification factor of the transistor.

Meanwhile, since a relationship among the respective currents with respect to the junction point A is the same as that in the first aspect of the first embodiment (equation 9), the relationship is expressed by the following equation (19) with use of the factors Ics and hfe and the equation (10).

$$I2 = Ic12 + 2 \times Ics/hfe \tag{19}$$

$$\therefore I2 = Ics \tag{20}$$

Hence, it will be seen from the equation (20) that the amplifier is not affected by the base current of the transistor.

In more detail, it has been considered in the first aspect of the first embodiment that the current amplification factor hfe of the transistor is very large and thus the base currents Ib12 and Ib13 of the transistors 12 and 13 are negligible. However, strictly speaking, this actually involves a slight error. For the purpose of avoiding this, in the second aspect of the first embodiment, the transistor 15 and the current source 16 are newly added to eliminate the influences of the base current, whereby the accuracy of the reference voltage can be improved and the reference voltage can be made substantially independent of fluctuations in the current amplification factor hfe of the manufactured transistors.

In this way, the second aspect of the first embodiment can have, in addition to the advantage of the first invention of the first invention, an additional advantage of being able to eliminate the influences of the base current of the transistor.

With respect to the method for eliminating the influences of the base current, another suitable method may be employed so long as a current having the same magnitude as the base current of the transistor drawn from the junction point A is drawn from the junction point B.

Figure 2:
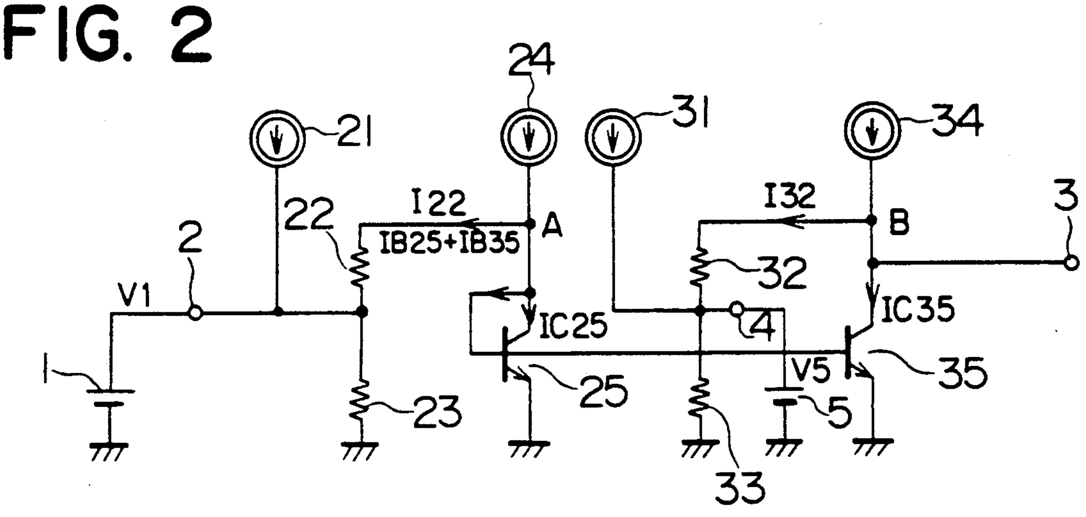
FIG. 2 is an arrangement of an amplified in accordance with the second embodiment.

FIG. 2 shows amplifier in accordance with an the second embodiment in which a reference voltage is independent of temperature. In FIG. 2, the illustrated amplifier has a first input terminal 2 to which a voltage is applied from a voltage source 1, a second input terminal 4 to which a voltage is similarly applied from a voltage source 5, and an output terminal 3. The amplifier further includes resistors 22, 23 32 and 33, current sources 21, 24, 31 and 34, and transistors 25 and 35 making up a current mirror circuit.

Explanation will next be made as to the operation of the second embodiment. Assume now in FIG. 2 that the voltage sources 1 and 5 are not connected to input terminals 2 and 4. Under such a condition of FIG. 2, the amplifier has its left and right structures which are the same and have the same constants, except that the transistor 25 is diode-connected. In other words, the resistor 22 corresponds to the resistor 32, the resistor 23 corresponds to the resistor 33, the current source 21 corresponds to the current source 31, the current source 24 corresponds to the current source 34, and the transistor 25 corresponds to the transistor 35, respectively. First, explanation will be made by referring to FIGS. 14A, 14B and 14C as to the left-side structure including the resistors 22 and 23, the current sources 21 and 24 and the diode-connected transistor 25.

Figure 14A:
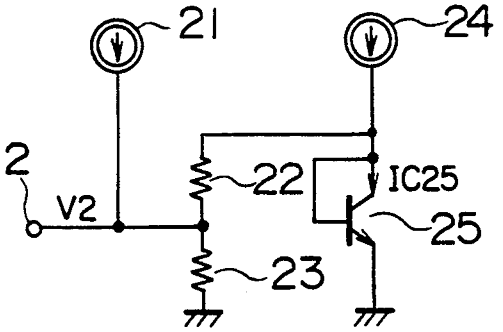
FIG. 14A is a part of the arrangement of the amplifier of FIG. 2 showing an input side of a current mirror circuit.
Figure 14B:
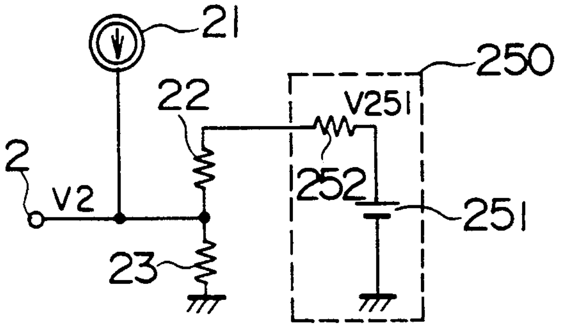
FIG. 14B is the part of FIG. 14A but in which a current source 24 and a transistor 25 are expressed in the form of an equivalent circuit.

In FIG. 14A, since the two signal sources are provided, consider the case where the current source 21 is open-circuited to analyze it by the principle of superposition. FIG. 14B corresponds to FIG. 14A but the diode-connected transistor 25 and the current source 24 are expressed by an equivalent circuit 250. A voltage V251 of a voltage source 251 and a resistive value R252 of a resistance 252 are expressed by the following equations (21) and (22), respectively.

$$V251 = Vf25 \quad (21)$$

$$R252 = (k \times T/q)/Ic25 \quad (22)$$

where,

Vf25: The forward voltage of the transistor 25

Ic25: The collector current of the transistor 25

Figure 14C:
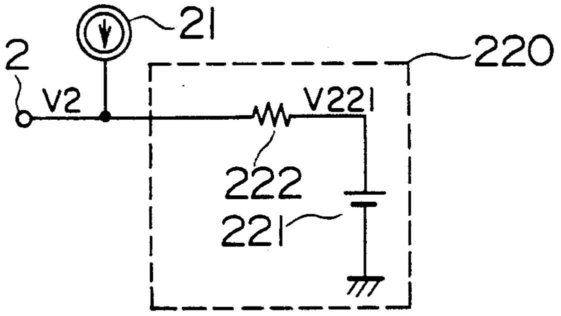
FIG. 14C is the part of FIG. 14A but in which the current source 24, transistor 25, resistors 22 and 23 are expressed in the form of an equivalent circuit.
Figure 15:
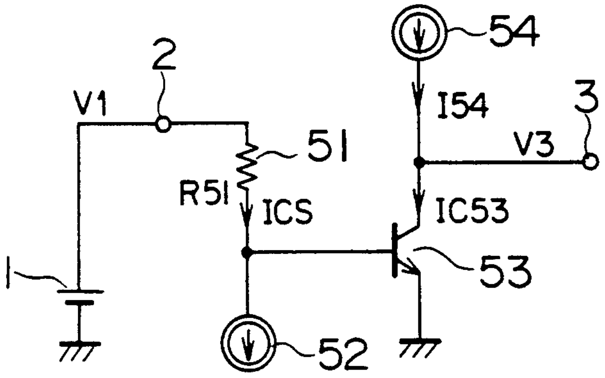
FIG. 15 PRIOR ART
FIG. 15 is an arrangement of a prior art amplifier.

FIG. 14C corresponds to FIG. 14B but the equivalent circuit 250 and the resistors 22 and 23 are expressed by an equivalent circuit 220 by the (Ho)-Thevenin theorem. A voltage V221 of a voltage source 221 and a resistive value R222 of a resistance 222 are expressed by the following equations (23) and (24), respectively.

$$V221 = Vf25 \times R23/(R22 + R252 + R23) \quad (23)$$

$$R222 = (R22 + R252) \times R23/(R22 + R252 + R23) \quad (24)$$

where,

R22: The resistive value of the resistor 22

R23: The resistive value of the resistor 23

Now, consider the current source 21. The current source 21 is also such a band gap current source as shown in JP-A-60-191508 and the current value Ics of the current source 21 is determined according to the equation (4).

Since the current value Ics of the current source 21 flows into the voltage source 221 through the resistance 222, the voltage V2 at input terminal 2 is expressed by the following equation (25).

$$V2 = V221 + R222 \times Ics \quad (25)$$

-continued $$\therefore V2 = M \times \{Vf25 + (k \times T/q) \times \ln(N) \times (R22 + R252)/Rcs\}$$

where, $M = R23/(R22 + R252 + R23)$ where, M=R23/(R22+R252+R23)

The equation (25) is very similar to the equation (13) in the first embodiment of the first invention, so that the voltage V2 independent of temperature can be generated in the same manner as in the first embodiment of the first invention. More specifically, the first term in the braces {} in the equation (25) indicates the forward voltage of the diode-connected transistor, which is about 650 mV and which varies with time at a rate of −2 mV/deg. Thus, when the (R22+R252) and the resistive value Rcs for setting the current of the current source are set so that a change of the second term in the braces {} to temperature becomes +2 mV/deg., the voltage changes to temperature in the first and second terms can be canceled each other. This voltage change is the same as the equation (15). Eventually, the voltage V2 can be made independent of temperature and the magnitude of the voltage can be freely set by the factor M. For example, when the voltage V2 is set to be 0.5 V, the factor M is set to be 0.5 V/1.25 V and the resistive and current values R22, R23, I24 and Ics of the resistors 22 and 23 and current sources 24 and 21 can be determined in accordance with the equations (4) and (21) to (25).

When the resistive value R22 of the resistance R252 is sufficiently small, the voltage V2 is expressed in the form of a ratio between the resistive values R22, R23 and the resistance Rcs for setting the current of the current source 21, which results in that the voltage V2 becomes independent of the absolute value of the resistive values and thus the amplifier can be easily configured.

When the circuit constants thus obtained are allocated to the corresponding elements of the right-side structure of FIG. 2, the right and left structures of FIG. 2 can be the similar circuits which are the same in the voltage and current of the corresponding elements with respect to the current mirror circuit of the transistors 25 and 35.

In FIG. 2, a current I24 of the current source 24 is divided at the junction point A into a current I22 to be passed through the resistor 22 and into a branch current toward the transistor 25. The branch current is further divided into a collector current Ic25 of the transistor 25 and the base current (Ib25+Ib35) of the transistors 25 and 35. Since the transistor 25 has a very large current amplification factor hfe, the base current (Ib25+Ib35) are negligible and thus the following relationships are satisfied.

$$I24 = I22 + Ic25 + (Ib25 + Ib35) \quad (26)$$

$$\therefore Ic25 \approx I24 - I22 \quad (27)$$

Meanwhile, a current I34 of the current source 34 is divided at the junction point B into a current I32 to be passed through the resistor 32 and a collector current Ic35 of the transistor 35 and the transistors 25 and 35 make up the current mirror circuit. Thus, since the collector currents Ic25 and Ic35 become equal to each other, the following equation (29) is obtained.

$$I34 = I32 + Ic35 \quad (28)$$

$$\therefore Ic35 = I34 - I32 = Ic25 \quad (29)$$

Since the current value I24 is set to be equal to the current value I34, the equation (30) is satisfied in accordance with the equations (27) and (29).

$$I22 \approx I32 \quad (30)$$

Hence, since the left and right circuits are same with respect to the current and element constants, the voltages are also the same and these circuits perform the similar operation.

The above explanation has been made in connection with the case where no load is connected to the the output terminal 3 connected to the junction point B and thus no current flows into and out of the output terminal 3. The circuit of FIG. 2 under such a condition that no current flows into and out of the output terminal 3, is the same as the state of the first embodiment of the first invention where the voltage V2 at the input terminal 2 is equal to the reference voltage.

Therefore, the similar operation will not be changed regardless of whether or not the voltage source 1 having the same magnitude as the voltage V2 obtained by the equation (25) is connected to the input terminal 2 and the voltage source 5 is similarly connected to the input terminal 4.

In the case where the voltage source 5 is not connected and the voltage source 1 is connected, when the voltage V1 supplied from the voltage source 1 is smaller than the reference voltage V2, a voltage across the resistor 22 is increased and the current I22 is increased so that the input current Ic25 of the current mirror circuit becomes small and the output current Ic35 of the current mirror circuit becomes also small. This causes a current flowing into the junction point B to be increased so that the potential V3 at the output terminal 3 becomes high. When the voltage V1 is inversely large, the voltage across the resistor 22 is decreased and the current I22 is decreased. Thus, the current value Ic25 as the input current of the current mirror circuit is increased and the current value I32 as the output current of the current mirror circuit is also increased. This causes a current flowing into the junction point B to be decreased so that the current I32 passing through the resistor 32 decreases and the output voltage V3 at the output terminal 3 becomes low.

The above operation is equivalent to the operation of the amplifier when an inverted input is applied to the input terminal 2, the reference voltage is connected to the input terminal 4 receiving a non-inverted input, and an output is connected to the output terminal 3.

The above operation has been explained in connection with the case where the voltage is applied to the input terminal 4 and the input terminal 2 is not connected. However, even when a voltage is applied to the input terminal 4 and the input terminal 2 is not connected, the similar operation can be achieved but the polarity becomes opposite to the above. In the latter case, its operation becomes equivalent to the operation of the amplifier wherein the non-inverted input is applied to the input terminal 4, the reference voltage is connected to the input terminal 2 receiving the inverted input, and the output is connected to the output terminal 3.

In this case, the reference voltage is expressed by the equation (25) and can be set to be below 1.25 V independently of temperature.

In this way, the aspect of the second embodiment has an advantage that, since the reference voltage V2 given by the equation (25) can be expressed in the form of an addition of the forward voltage obtained through the diode-connected transistor 25 and current source 24 to the voltage corresponding in magnitude to the resistance voltage-division means of the resistors 22 and 23 multiplied by the temperature-independent coefficients including the absolute temperature T obtained from the current source 21 and the resistance ratio, when a ratio between these voltages is changed, the temperature characteristic the amplifier can be controlled and and its magnitude can be easily set by the coefficient M.

Further, when the terminal voltages of the current sources 24 and 34 are the diode forward voltages and voltages at junction points between the resistors 22 and 23 and between the resistors 32 and 33 as the outputs of the resistance voltage-division means are set to be below the diode forward voltage and when such low-voltage operated current sources as shown in JP-A-60-191508 are employed, the power source voltage can be lowered down to about 0.9 V.

The embodiment has an additional effect that, since the values of the resistors 22, 23, 32 and 33 associated with the reference voltage have a relationship in the form of a ratio in the equation (25), the amplifier can be easily made even in the form of a semiconductor integrated circuit independently of the accuracy of the absolute value.

In addition, it is seen from the equation (25) that the characteristics of the amplifier to temperature can be determined by (R22+R252)/Rcs independently of R23, which results in that the decision of the reference voltage can advantageously be freely controlled by the factor R23.

Figure 3:
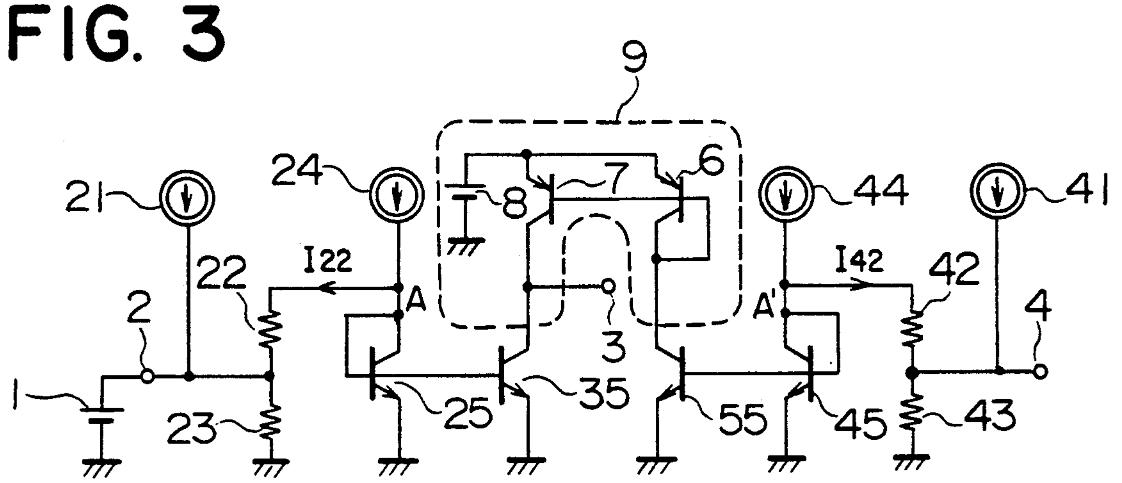
FIG. 3 is an arrangement of an amplifier in accordance with the third embodiment.

FIG. 3 shows amplifier in accordance with an the third embodiment.

The amplifier of FIG. 3 includes a first voltage/current converting means comprising the right-side similar circuit of the aforementioned second embodiment but with the transistor 35 removed, a second voltage/current converting means similar to the first one having an input terminal 4, resistors 42 and 43, current sources 41 and 44, and transistors 45 and 55, a current comparing means 9 having transistors 6 and 7 and a voltage source 8, and an output terminal 3.

The operation of the third embodiment will be explained. The operation of the first voltage/current converting means in the third embodiment is substantially the same as that of the left-side similar circuit of FIG. 2 in the second embodiment, because they have substantially the same structure. The operation of the second voltage/current converting means is also the same as that of the first one. The voltage when no voltages are applied to the input terminals 2 and 4 is expressed by the equation (25) as in the second embodiment. When the corresponding parts in the first and second voltage/current converting means have equal currents and element constants, their voltages are also equal to each other and thus the first and second voltage/current converting means perform the similar operation. Thus, the collector currents of the transistors 35 and 55 as the outputs of the first and second voltage/current converting means are equal to each other, whereby no current appears at the output terminal 3 of the current/voltage comparing means 9 for comparing the outputs of the first and second voltage/current converting means. That is, the collector current of the transistor 55 applied to the current mirror circuit of the voltage/current comparing means 9 is converted into a current which is compared with the collector current of the transistor 35 has the same magnitude as the first-mentioned collector current but the opposite direction or sense to the first-mentioned collector current, so that a current corresponding to a difference between the first- and second-mentioned collector currents appears at the output terminal 3.

The state of the embodiment of FIG. 3 when no current flows in and out of the output terminal 3 is the same as the state of the embodiment of the second invention when the voltage V2 at the input terminal 2 is equal to the reference voltage. This holds true when the voltages applied to the input terminals 2 and 4 are equal to each other. Accordingly, even when the third embodiment comprises the two voltage/current converting means and current comparing means, the third embodiment can have substantially the same effect as the second embodiment.

Figure 4:
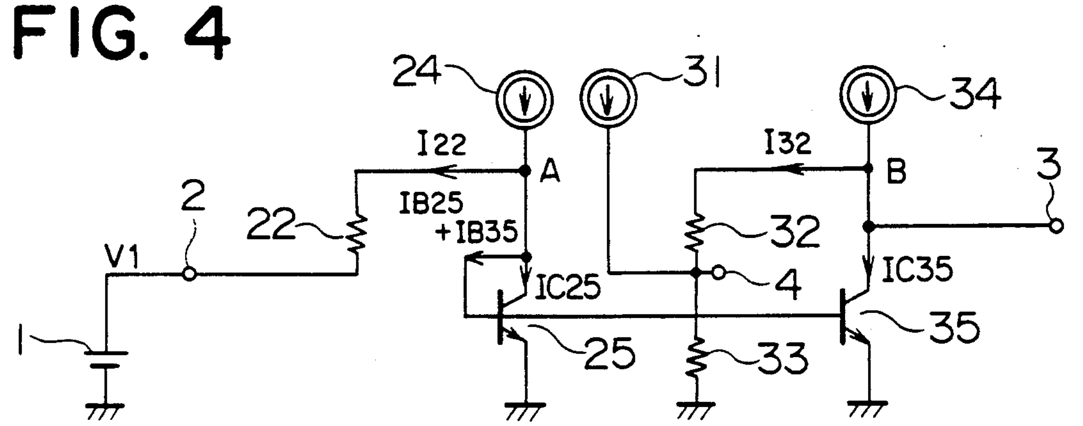
FIG. 4 is an arrangement of an amplifier in accordance with the fourth embodiment.

Shown in FIG. 4 is an amplifier in accordance with of the fourth embodiment, which has the same arrangement as the second embodiment but with the current source 21 and the resistor 23 in FIG. 2 removed.

Explanation will next be made to the operation of the fourth embodiment. It is substantially the same as that of the second embodiment. In more detail, in FIG. 2 of the second embodiment, when the signal source impedance of the voltage source 1 connected to the input terminal 2 is sufficiently small as compared to the resistive value R22 of the resistor 22, the current flowing through the resistor 22 is determined by the voltage V1 of the voltage source 1. Thus, in the operation of the fourth embodiment, as in the operation of the second embodiment, the output current or voltage corresponding to a potential difference between the voltage V1 and the reference voltage V2 based o the equation (25) appears at the output terminal 3. At this time, the current of the current source 21 flows into the voltage source 1 and the current flowing through the resistor 23 is supplied from the voltage source 1 and has a magnitude corresponding to the value of the voltage V1. Therefore, it will be seen that these elements do not contribute substantially to the operation of the amplifier. Thus, it will be appreciated that the fourth embodiment can have substantially the same effect as the first aspect of the second embodiment even when the current source 21 and the resistor 23 are eliminated.

However, in FIG. 2 showing the second embodiment, when the voltage source 1 is not connected, the input terminal 2 has the same potential as the reference voltage V2; whereas in FIG. 4 showing the fourth embodiment, the potential at the input terminal 2 corresponds to the diode forward voltage. This difference appears in the form of such a phenomenon that, when the signal source impedance of the voltage source 1 is large, the voltage at the input terminal 2 is pulled in which direction from the no-load voltage value of the voltage source. However, the input terminal 4 has the same potential as the reference voltage V2.

In this way, even the fourth embodiment can also have, in addition to the same advantage as in the second embodiment, an additional advantage that the voltage source 21 and the resistor 23 can be eliminated and thus the amplifier can be made with a simpler arrangement.

Figure 5:
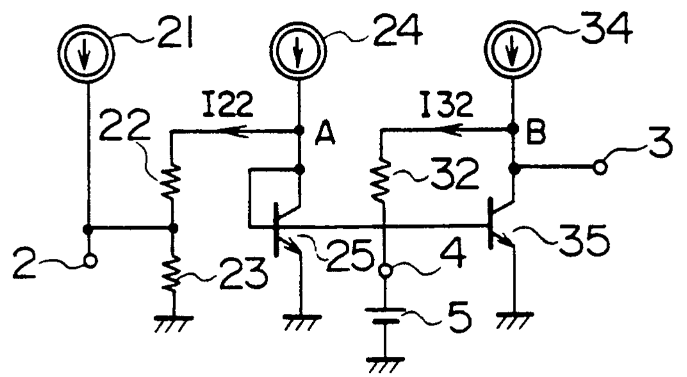
FIG. 5 is an arrangement of an amplifier in accordance with the fifth embodiment.

FIG. 5 shows an arrangement of an amplifier in accordance with the fifth embodiment, which has substantially the same arrangement as the second embodiment of FIG. 2, except that the current source 31 and the resistor 33 in FIG. 2 are eliminated and the voltage source 5 is connected to the input terminal 4.

Explanation will next be made as to the operation of the fifth embodiment. The operation of the fifth embodiment is substantially the same as that of the second embodiment. In more detail, in FIG. 2 of the second embodiment, when the signal source impedance of the voltage source 5 connected to the input terminal 4 is sufficiently small as compared to the resistive value R32 of the resistor 32, the current flowing through the resistor 32 is determined by the voltage V1 of the voltage source 5. Thus, in the operation of the fourth embodiment, as in the operation of the second embodiment, the output current or voltage corresponding to a potential difference between the voltage V1 and the reference voltage V2 based on the equation (25) appears at the output terminal 3. At this time, the current of the current source 31 flows into the voltage source 5 and the current flowing through the resistor 33 is supplied from the voltage source 5 and has a magnitude corresponding to the value of the voltage V5. Therefore, it will be seen that these elements do not contribute substantially to the operation of the amplifier. Thus, it will be appreciated that the fourth embodiment can have substantially the same effect as the second embodiment even when the current source 31 and the resistor 33 are eliminated.

However, in FIG. 2 showing the second embodiment, when the voltage source 5 is not connected, the input terminal 4 has the same potential as the reference voltage V2; whereas, in FIG. 5 showing the fifth embodiment, the potential at the input terminal 4 corresponds to the diode forward voltage. This difference appears in the form of such a phenomenon that, when the signal source impedance of the voltage source 5 is large, the voltage at the input terminal 4 is pulled in which direction from the no-load voltage value of the voltage source. However, the input terminal 2 has the same potential as the reference voltage V2.

In this way, even the fifth embodiment can also have, in addition to the same advantage as in the second embodiment, an additional advantage that the voltage source 31 and the resistor 33 can be eliminated and thus the amplifier can be made with a simpler arrangement.

Figure 6:
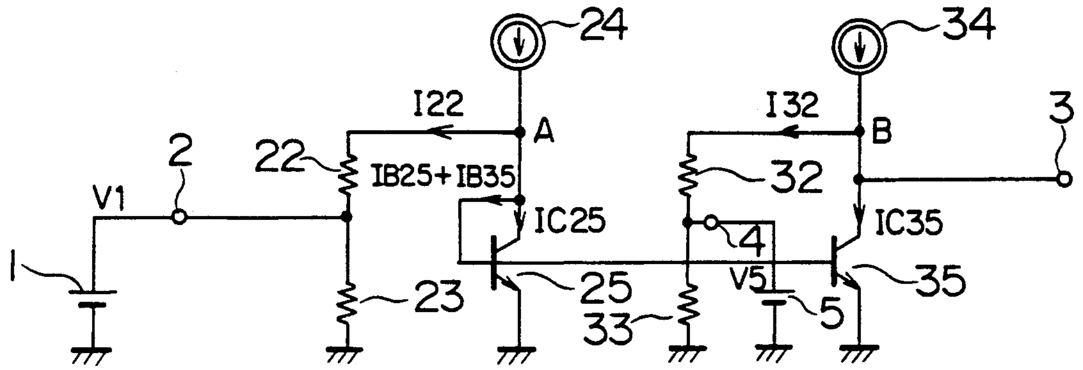
FIG. 6 is an arrangement of an amplifier in accordance with the sixth embodiment.

FIG. 6 shows an arrangement of an amplifier in accordance with the sixth embodiment, which has substantially the same arrangement as second embodiment of FIG. 2, except that the current sources 21 and t31 in FIG. 2 are eliminated and the diode-connected transistor 25 is provided. The arrangement of FIG. 6 has substantially the same left-side and right-side structures having the same constants. That is, in the left- and right-side structures, the resistor 22 corresponds to the resistor 32, the resistor 23 corresponds to the resistor 33, the current source 24 corresponds to the voltage source 34, and the transistor 25 corresponds to the transistor 35, respectively.

The, operation of the sixth embodiment will then be explained. The operation of the sixth embodiment is substantially the. same as that of the second embodiment. When both or either one of the input terminals 2 and 4 is open-circuited and the other input terminal has the same potential as the reference voltage, the left- and right-side circuits perform the similar operation. However, since the current source 21 and the current source 31 are not provided, the reference voltage has a value expressed by the following equation (31) corresponding to the equation (25) but when the resistance Rcs for setting the current of the current source is set to be infinite.

$$V2=M\times Vf25 \quad (31)$$

where, $M=R23/(R22+R252+R23)$

In this way, in the sixth embodiment in FIG. 6, since the diode forward voltage of the diode-connected transistor is utilized as the source of the reference voltage, when the reference voltage is set to be about 650 mV, the amplifier can have a temperature characteristic which varies at a rate of −2 mV/deg. and the reference voltage can be freely set by multiplying it by the coefficient M. This is advantageous from the viewpoint of the arrangement when a reference voltage having a negative change to temperature is necessary or when the temperature characteristic of the reference voltage has no restrictions and it is desired to reduce the number of necessary elements, since the number of current sources can be reduced by 2 when compared to the first embodiment of the second invention. The sixth embodiment has substantially the same advantages as of the second embodiment, except that the temperature characteristic of the reference voltage is negative and cannot be controlled.

Since the terminal voltages of the current sources 24 and 34 do not exceed the diode forward voltage, when such a low-voltage operated type current source as shown in JP-A-60-191508 is employed, the power source voltage can be lowered down to about 0.9 V.

When the resistive value R252 is sufficiently smaller than the resistive value R22, the voltage V2 can be expressed in the form of a ratio between the resistive values R22 and R23 independent of the absolute value of the resistive values and the circuit formation of the amplifier can be facilitated.

Figure 7:
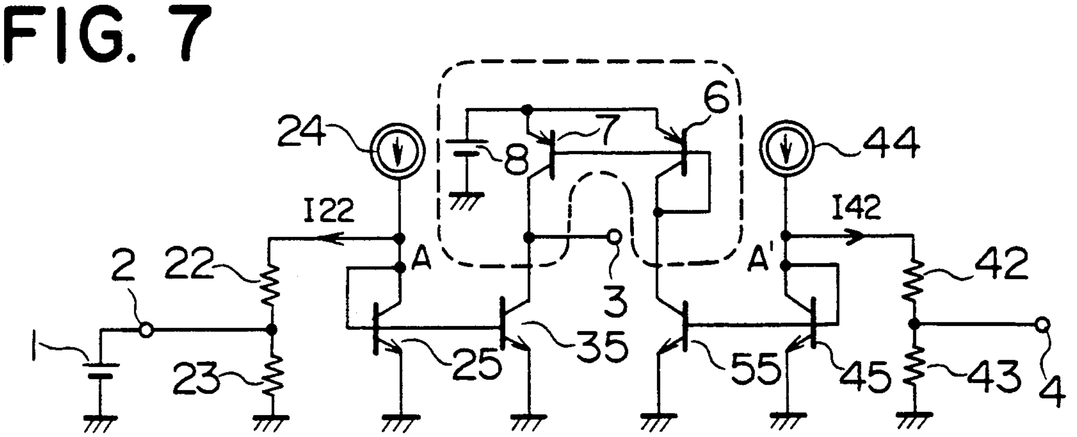
FIG. 7 is an arrangement of an amplifier in accordance with the seventh embodiment.

FIG. 7 is an arrangement of an amplifier in accordance with the seventh embodiment, which comprises a first voltage/current converting means corresponding to the right-side similar circuit in FIG. 6 of the sixth embodiment but with the transistor 35 removed; a second voltage/current converting means similar to the first one including an input terminal 4, resistors 42 and 43, a current source 44 and transistors 45 and 55; and a voltage/current comparing means 9 including transistors 6 and 7 and a voltage source 8. The amplifier of FIG. 7 also includes an output terminal 3.

Explanation will next be made as to the operation of the seventh embodiment. The operation of the first voltage/current converting means in the seventh embodiment is the same as that of the left-side similar circuit having the same structure in FIG. 6 of the sixth embodiment. The operation of the second voltage/current converting means is also the same as that of the above left-side similar circuit. The voltage V2 when no voltages are applied to the input terminals 2 and 4 is expressed by the equation (31) as in the sixth embodiment. Assuming that the first and second voltage/current converting means have the same element constants and the same currents in their corresponding parts, the first and second voltage/current converting means also has the same voltages in their corresponding parts. This means that the first and second voltage/current converting means perform the similar operation. The collector currents of the transistors 35 and 55 as the outputs of the first and second voltage/current converting means become the same, which results in that no current flows at the output terminal 3 of the current/voltage comparing means 9 for comparison between the above collector currents. In other words, the collector current of the transistor 55 applied to a current mirror circuit forming the voltage/current comparing means 9 is converted into a current which has the same magnitude but the opposite sense, and the converted current is compared with the collector current of the transistor 35, so that a current indicative of a difference between these currents appears at the output terminal 3.

The state when no current flows into and out of the output current 3 is the same as the state of embodiment the sixth embodiment when the voltage V2 at the input terminal 2 is equal to the reference voltage. This means that the amplifier comprising the two voltage/current converting means and the voltage/current comparing means also can have substantially the, same effect as the sixth embodiment.

In this way, even the seventh embodiment can have substantially the same effect as the sixth embodiment.

Figure 8:
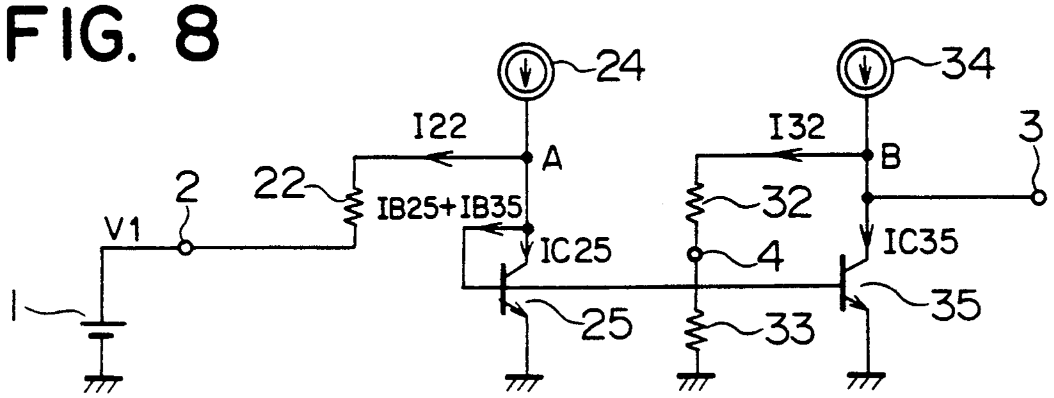
FIG. 8 is an arrangement of an amplifier in accordance with the eighth embodiment.

Shown in FIG. 8 is an arrangement of an amplifier in accordance with the eighth embodiment, which has substantially the same arrangement as the sixth embodiment of FIG. 6 but with the resistor 23 in FIG. 6 removed.

The operation of the embodiment of the eighth embodiment will now be explained. It is substantially the same as that of the sixth embodiment.

More specifically, in FIG. 6 showing the sixth embodiment, when the signal source impedance of the voltage source 1 connected to the input terminal 2 is sufficiently small as compared to the resistive value R22 of the resistor 22, the current flowing through the resistor 22 is determined by the voltage V1 of the voltage source 1. Thus, in the operation of the eighth embodiment, as in the operation of the sixth embodiment, the output current or voltage corresponding to a potential difference between the voltage V1 and the reference voltage V2 based on the equation (31) appears at the output terminal 3. At this time, the current flowing through the resistor 23 is supplied from the voltage source 1 and has a magnitude corresponding to the value of the voltage V1. Therefore, it will be seen that these elements do not contribute substantially to the operation of the amplifier. Thus, it will be appreciated that the eighth embodiment can have substantially the same effect as the sixth embodiment even when the resistor 23 is eliminated.

However, in FIG. 6 showing the sixth embodiment, when the voltage source 1 is not connected, the input terminal 2 has the same potential as the reference voltage V2; whereas, in FIG. 8 showing the eight embodiment, the potential at the input terminal corresponds to the diode forward voltage. This difference appears in the form of such a phenomenon that, when the signal source impedance of the voltage source 1 is large, the voltage at the input terminal 2 is pulled in which direction from the no-load voltage value of the voltage source. However, the input terminal 4 has the same potential as the reference voltage V2.

In this way, even the eighth embodiment can have substantially the same advantage as in the sixth embodiment, and can also have an additional advantage that the resistor 23 can be eliminated and thus the amplifier can be made with a simpler arrangement.

Figure 9:
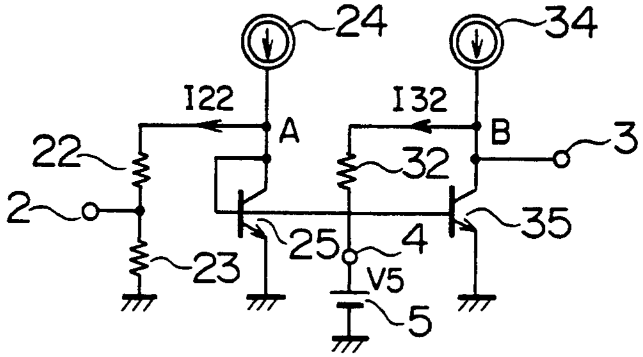
FIG. 9 is an arrangement of an amplifier in accordance with the ninth embodiment.

FIG. 9 shows an arrangement of an amplifier in accordance with the ninth embodiment, which has substantially the same arrangement as the the sixth embodiment of FIG. 6, except that the resistor 33 in FIG. 6 is eliminated.

The operation of the ninth embodiment will then be explained. The operation of the ninth embodiment is substantially the same as that of the sixth embodiment. More specifically, in FIG. 6 showing the sixth embodiment, when the signal source impedance of the voltage source 5 connected to the input terminal 4 is sufficiently small as compared to the resistive value R32 of the resistor 32, the current flowing through the resistor 32 is determined by the voltage V1 of the voltage source 1. Thus,. in the operation of the ninth embodiment, as in the operation of the sixth embodiment, the output current or voltage corresponding to a potential difference between the voltage V1 and the reference voltage V2 based on the equation (31) appears at the output terminal 3. At this time, the current flowing through the resistor 33 is supplied from the voltage source 1 and has a magnitude corresponding to the value of the voltage V5. Therefore, it will be seen that these elements do not contribute substantially to the operation of the amplifier. Thus, it will be appreciated that the ninth embodiment can have substantially the same effect as the sixth embodiment even when the resistor 33 is eliminated.

However, in FIG. 6 showing the sixth embodiment, when the voltage source 5 is not connected, the input terminal 4 has the same potential as the reference voltage V2; whereas, in FIG. 9 showing the the ninth embodiment, the potential at the input terminal corresponds to the diode forward voltage. This difference appears in the form of such a phenomenon that, when the signal source impedance of the voltage source 5 is large, the voltage at the input terminal 4 is pulled in which direction from the no-load voltage value of the voltage source. However, the input terminal 2 has the same potential as the reference voltage V2.

In this way, even the ninth embodiment can have substantially the same advantage as in the sixth embodiment, and can also have an additional advantage that the resistor 33 can be eliminated and thus the amplifier can be made with a simpler arrangement.

Figure 10:
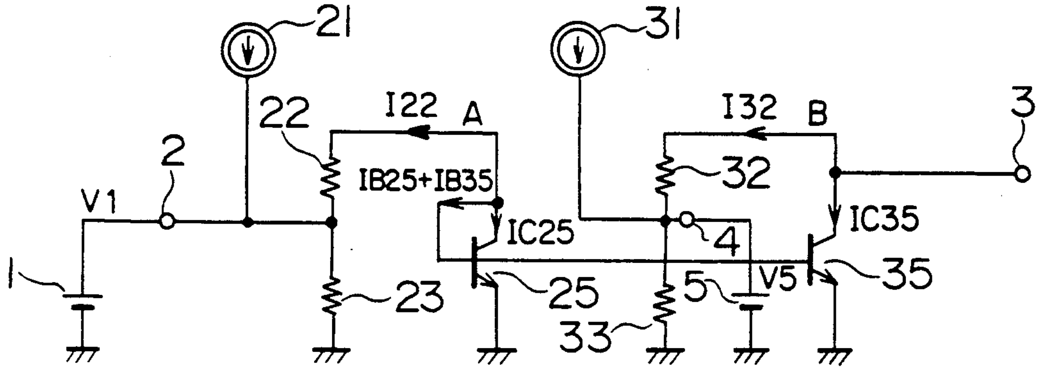
FIG. 10 is an arrangement of an amplified in accordance with the tenth embodiment.

FIG. 10 shows an arrangement of an amplifier in accordance with the tenth embodiment, which has substantially the same arrangement as the second embodiment of FIG. 2, except that the current sources 24 and 34 in FIG. 2 are eliminated and the diode-connected transistor 25 is provided. The arrangement of FIG. 10 has substantially the same left-side and right-side structures having the same constants. That is, in the left- and right-side structures, the resistor 22 corresponds to the resistor 32, the resistor 23 corresponds to the resistor 33, the current source 21 corresponds to the voltage source 31, and the transistor 25 corresponds to the transistor 35, respectively.

The operation of the tenth embodiment will then be explained. The operation of the tenth embodiment is substantially the same as that of the second embodiment. When both or either one of the input terminals 2 and 4 is open-circuited and the other input terminal has the same potential as the reference voltage, the left- and right-side circuits perform the similar operation. However, since the current source 24 and the current source 34 are not provided, the reference voltage must be set to be above the diode forward voltage. That is, the currents, which are supplied to the junction points A and B from the current sources 24 and 34 in the embodiment of the second invention, are set to be supplied from the current source 31 through the resistors 22 and 32.

Even with such an arrangement, the reference voltage is the same as in the second embodiment and is expressed by the equation (25).

In this way, when the reference voltage is set to be above the diode forward voltage, the tenth embodiment can also have, in addition to the advantage of the second embodiment, an additional advantage that the voltage source 24 and the current source 34 can be eliminated and the tenth embodiment can be made with a simpler arrangement.

When the resistive value R252 is sufficiently smaller than the resistive value R22, the voltage V2 is expressed in the form of a ratio between the resistive values R22 and R23 independent of the absolute values of the resistive values and thus the circuit formation of the amplifier can be facilitated.

Figure 11:
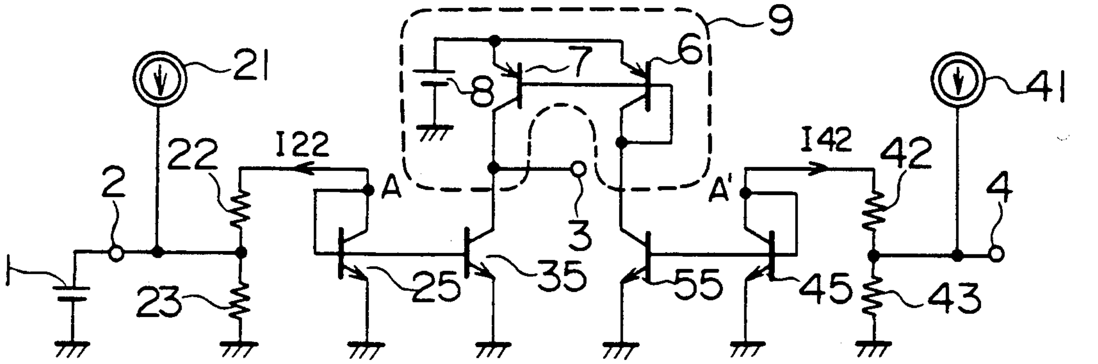
FIG. 11 is an arrangement of an amplifier in accordance with the eleventh embodiment.

FIG. 11 shows an arrangement of an amplifier in accordance with the eleventh embodiment, which comprises a first voltage/current converting means corresponding to the right-side similar circuit in FIG. 10 of the embodiment of the tenth invention but with the transistor 35 removed; a second voltage/current converting means similar to the first one including an input terminal 4, resistors 42 and 43, a current source 41 and transistors 45 and 55; and a voltage/current comparing means 9 including transistors 6 and 7 and a voltage source 8. The amplifier of FIG. 11 also includes an output terminal 3.

Explanation will next be made as to the operation of the eleventh embodiment. The operation of the first voltage/current converting means in the eleventh embodiment is the same as that of the left-side similar circuit having the same structure in FIG. 10 of the tenth embodiment. The operation of the second voltage/current converting means is also the same as that of the above left-side similar circuit. The voltage V2 when no voltages are applied to the input terminals 2 and 4 is expressed by the equation (25) as in the tenth embodiment. Assuming that the first and second voltage/current converting means have the same element constants and the same currents in their corresponding parts, the first and second voltage/current converting means also has the same voltages in their corresponding parts. This means that the first and second voltage/current converting means perform the similar operation. The collector currents of the transistors 35 and 55 as the outputs of the first and second voltage/current converting means become the same, which results in that no current flows at the output terminal 3 of the current/voltage comparing means 9 for comparison between the above collector currents. In other words, the collector current of the transistor 55 applied to a current mirror circuit forming the voltage/current comparing means 9 is converted into a current which has the same magnitude but the opposite sense, and the converted current is compared with the collector current of the transistor 35, so that a current indicative of a difference between these currents appears at the output terminal 3.

The state when no current flows into and out of the output current 3 is the same as the state of the embodiment of the tenth invention when the voltage V2 at the input terminal 2 is equal to the reference voltage. This means that the amplifier comprising the two voltage/-current converting means and the voltage/current comparing means also can have substantially the same effect as the tenth embodiment.

In this way, even the eleventh embodiment can have substantially the same effect as the tenth embodiment.

Figure 12A:
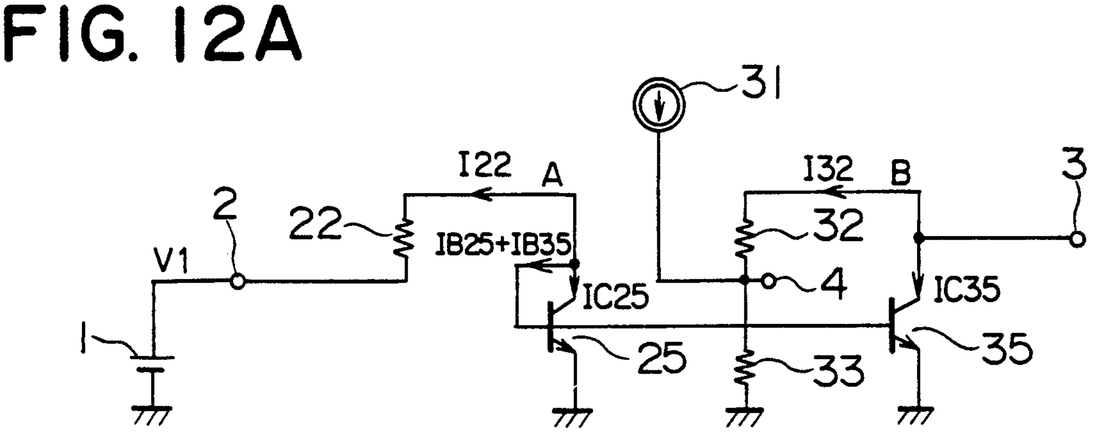
FIG. 12A is an arrangement of an amplifier in accordance with a first aspect of the twelfth embodiment.
Figure 12B:
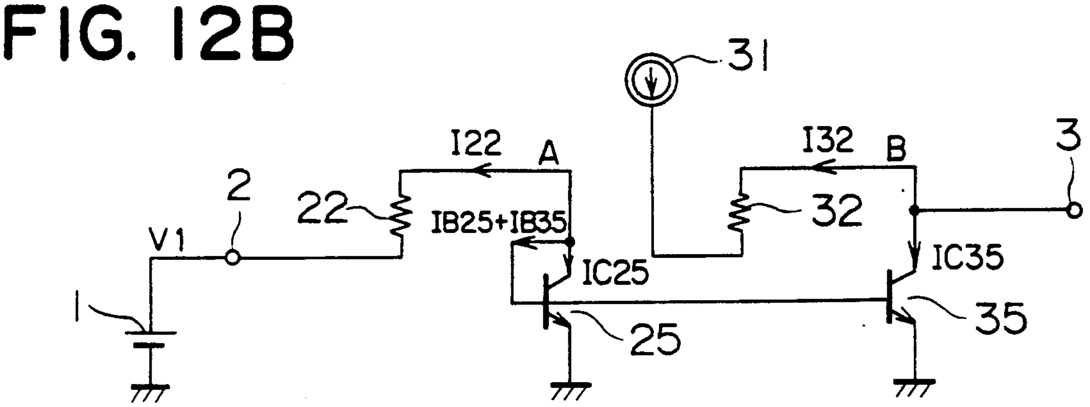
FIG. 12B is an arrangement of an amplifier in accordance with a second aspect of the twelfth embodiment

FIG. 12A shows an arrangement of an amplifier in accordance with a first aspect of the twelfth embodiment, which has substantially the same arrangement as the tenth embodiment of FIG. 10, except that the resistor 23 in FIG. 10 is eliminated.

The operation of the first aspect of the twelfth embodiment will now be explained. It is substantially the same as that of the tenth embodiment. More specifically in FIG. 10 showing the the tenth embodiment, when the signal source impedance of the voltage source 1 connected to the input terminal 2 is sufficiently small as compared to the resistive value R22 of the resistor 22, the current flowing through the resistor 22 is determined by the voltage V1 of the voltage source 1. Thus, in the operation of the twelfth embodiment, as in the operation of the tenth embodiment, the output current or voltage corresponding to a potential difference between the voltage V1 and the reference voltage V2 based on the equation (25) appears at the output terminal 3. At this time, the current flowing through the resistor 23 is supplied from the voltage source 1 and has a magnitude corresponding to the value of the voltage V1. Therefore, it will be seen that these elements do not contribute substantially to the operation of the amplifier. Thus, it will be appreciated that the twelfth embodiment can have substantially the same effect as the tenth embodiment even when the resistor 23 is eliminated.

However, in, FIG. 10 showing the tenth embodiment, when the voltage source 1 is not connected, the input terminal 2 has the same potential as the reference voltage V2; whereas, in FIG. 12A showing the first aspect of the twelfth embodiment, the potential at the input terminal corresponds to the diode forward voltage. This difference appears in the form of such a phenomenon that, when the signal source impedance of the voltage source 1 is large, the voltage at the input terminal 2 is pulled in which direction from the no-load voltage value of the voltage source. However, the input terminal 4 has the same potential as the reference voltage V2.

In this way, even the first aspect of the twelfth embodiment can have substantially the same advantage as in of the tenth embodiment, and can also have an additional advantage that the resistor 23 can be eliminated and thus the amplifier can be made with a simpler arrangement.

FIG. 12A shows an arrangement of an amplifier in accordance with a second aspect of the twelfth embodiment, which has substantially the same arrangement as the first aspect of the twelfth embodiment of FIG. 12A, except that the resistor 33 in FIG. 12A is eliminated.

The operation of the second aspect of the twelfth embodiment will now be explained. It is substantially the same as that of the first aspect of the twelfth embodiment, except that the resistor 33 is not provided. However, the absence of the resistor 33 causes the setting of the reference voltage to be limited. That is, due to the absence of the resistor 33, the value of the reference voltage is expressed by the following equation (32) corresponding to the equation (25) of the embodiment of the second invention when the resistive value R33 of the resistor 33 is set to be infinite.

$$V2 = Vf25 + (k \times T/q) \times ln(N) \times (R22 + R252 + R252)/Rcs \quad (32)$$

$\therefore M = 1$

In this way, although the setting range of the reference voltage is restricted, the second aspect of the twelfth embodiment can also have, in addition to the advantage of the first aspect of the twelfth embodiment, an additional advantage that the resistor 33 can be eliminated and thus the second aspect of the twelfth embodiment can be arranged with a simpler arrangement.

When the reference voltage V2 is applied to the input terminal 2, even, in the second aspect of the twelfth embodiment, the input- and output-side circuits of the current mirror circuit perform the similar operation. However, since the terminal voltage of the current source 31 causes generation of the high reference voltage based on the equation (32), the power source voltage for driving of the amplifier cannot be lowered. Hence, when the establishment of the voltage similar operation is given up and the resistor 32 is eliminated, only the current similar operation can be established. Even this case can have the same reference voltage and effect as the second aspect of the twelfth embodiment. However, this arrangement is exactly the same as the first aspect of the first embodiment. Thus, the first aspect of the first embodiment can be considered to be a modification of the second embodiment.

Figure 13:
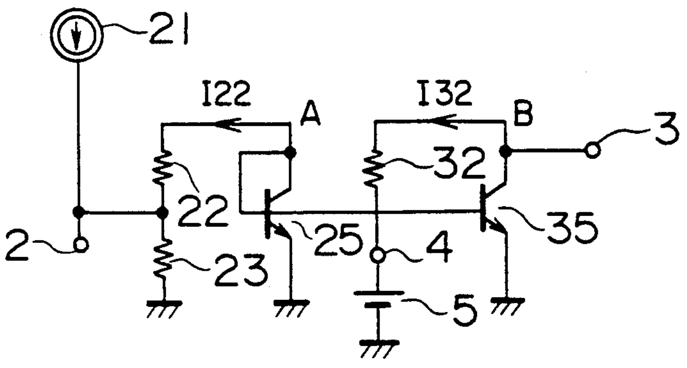
FIG. 13 is an arrangement of an amplifier in accordance with a first aspect of the thirteenth embodiment.

FIG. 13 shows an arrangement of an amplifier in accordance with the thirteenth embodiment, which has substantially the same arrangement as the tenth embodiment of FIG. 10 but with the resistor 33 in FIG. 10 removed.

The operation of the thirteenth embodiment will now be explained. It is substantially the same as that of the tenth embodiment. More specifically, in FIG. 10 showing the tenth embodiment, when the signal source impedance of the voltage source 5 connected to the input terminal 4 is sufficiently small as compared to the resistive value R32 of the resistor 32, the current flowing through the resistor 32 is determined by the voltage V5 of the voltage source 5. Thus, in the operation of the thirteenth embodiment, as in the operation of the tenth embodiment, the output current or voltage corresponding to a potential difference between the voltage V1 and the reference voltage V2 based on the equation (25) appears at the output terminal 3. At this time, the current flowing through the resistor 33 is supplied from the voltage source 5 and has a magnitude corresponding to the value of the voltage V5. Therefore, it will be seen that these elements do not contribute substantially to the operation of the amplifier. Thus, it will be appreciated that the thirteenth embodiment can have substantially the same effect as the tenth embodiment even when the resistor 33 is eliminated.

However, in FIG. 10 showing the tenth embodiment, when the voltage source 5 is not connected, the input terminal 4 has the same potential as the reference voltage V2; whereas, in FIG. 13 showing the thirteenth embodiment, the potential at the input terminal corresponds to the diode forward voltage. This difference appears in the form of such a phenomenon that, when the signal source impedance of the voltage source 5 is large, the voltage at the input terminal 4 is pulled in which direction from the no-load voltage value of the voltage source. However, the input terminal 2 has the same potential as the reference voltage V2.

In this way, even the thirteenth embodiment can have substantially the same advantage as in the tenth embodiment, and can also have an additional advantage that the resistor 33 can be eliminated and thus the amplifier can be made with a simpler arrangement.

In the second to thirteenth embodiments, the junction B has been connected directly to the output terminal 3. However, such an arrangement may be employed that the transistor 15 and the current source 16 are added to extract from the junction point B a current having the same magnitude as the base current of the transistors 25 and 35 as in the second aspect of the first embodiment, whereby the influences of the base current of the transistors 25 and 35 at the junction point A is compensated for. Further, another suitable method for eliminating the influences of the base current may be employed so long as a current having the same magnitude as the base current of the transistors and extracted from the junction point A can be eventually extracted from the junction point B.

Although the similar circuits as the input and output parts of the current mirror circuit have been set to have the same current values in the first to thirteenth embodiments, the current ratio between the input and output of the current mirror circuit may be set at a value R other than 1 and the currents of the similar circuits may be set to have the same as the value R. When the value R is set to be large, the output current at the output terminal 3 becomes large and its load driving ability can be advantageously enhanced.

Though the input and output current values of the current mirror circuit of the current comparing means 9 including the transistors 6 and 7 are set to be equal to each other in the third, seventh and eleventh embodiments, the input/output current ratio of the current mirror circuit may be set to be a value R other than 1 and the current ratio between the currents of the similar circuits of the first and second voltage/current converting means may be set to be equal to the same value R. When the value R is set to be large, the output current at the output terminal 3 becomes large and its load driving ability can be advantageously enhanced.

Further, the current value of the current source is proportional to the absolute temperature T and inversely proportional to the set resistance Rcs in the first to thirteenth embodiments, but the current source may have arbitrary characteristics. In the latter case, the influences caused by variations and fluctuations in the reference voltage, temperature and power source voltage provide characteristics different from those in these embodiments.

Though the current mirror circuit comprises bipolar transistors in the first to thirteenth embodiments, the current mirror circuit may comprise any elements. In the latter case, the temperature characteristic of the reference voltage becomes different from the former case due to the elements.

Although a D.C. signal is used as the input signal in the first to thirteenth embodiments, an A.C. signal may be used as the input signal. The latter case is advantageous in that, when the A.C. signal is supplied through a coupling capacitor, in particular, the second, third, sixth, seventh, tenth and eleventh embodiments are operated so that the D.C. potential at the input terminal 2 causes the similar operation, whereby the need for newly adding a bias circuit can be eliminated.

In the first to thirteenth embodiments, the lowest power source voltage necessary for operating the amplifier corresponds to an addition of the terminal voltages of the current sources to about 0.2 V. Accordingly, when the reference voltage is set to be lower than the voltage of the input terminal of the current mirror circuit, the power source voltage can be set to be low.

In addition, since the resistors included in the first to thirteenth embodiments are expressed in the form of a ratio between their resistive values in the equation indicative of the reference voltage, the accuracy of the absolute values of their resistors is not so important and mainly its relative accuracy becomes vital. Thus, these embodiments can be easily made advantageously in the form of a semiconductor integrated circuit, respectively.

What is claimed is:

1. An amplifier comprising:

an input terminal;

a current mirror circuit having an input terminal and an output terminal constituting an output terminal of the amplifier;

a resistor having a first end connected to said input terminal of said amplifier and a second end connected to said input terminal of said current mirror circuit; and current generating means, connected to said output terminal of said current mirror circuit, for supplying a current which is divided between a first portion drawn by said current mirror circuit and a second portion defining an output current for being supplied to a load adapted to be connected to said output terminal of the amplifier.

2. An amplifier comprising:

a current mirror circuit;

first resistor voltage-division means connected to an input of said current mirror circuit;

first current generating means for supplying a current to a voltage division output of said first resistor voltage-division means;

second current generating means connected to the input of said current mirror circuit;

second resistor voltage-division means connected to an output of said current mirror circuit;

third current generating means for supplying a current to a voltage division output of said second resistor voltage-division means; and fourth current generating means connected to the output of said current mirror circuit, wherein the output of said first resistor voltage-division means is used as a first input of said amplifier, the output of said second resistor voltage-division means is used as a second input of the amplifier, and the output of said current mirror circuit is used as an output of the amplifier.

3. An amplifier comprising:

a current mirror circuit;

resistor voltage-division means connected to an input of said current mirror circuit;

first current generating means for supplying a current to a voltage division output of said resistor voltage-division means;

second current generating means connected to the input of said current mirror circuit;

first and second voltage/current converting means having input terminals used as outputs of said resistor voltage-division means and having output terminals used as an output of said current mirror circuit; and current comparing means for comparing currents at the output terminals of said first and second voltage/current converting means, wherein the input terminal of said first voltage/current converting means is used as a first input of said amplifier, the input terminal of said second voltage/current converting means is used as a second input of said amplifier, and an output of said current comparing means is used as an output of the amplifier.

4. An amplifier comprising:

a current mirror circuit;

first current generating means connected to an input of said current mirror circuit;

resistor voltage-division means connected to an output of said current mirror circuit;

second current generating means for supplying a current to a voltage-division output of said resistor voltage-division means; and third current generating means connected to the output of said current mirror circuit, wherein the input of said current mirror circuit is connected to a first input of said amplifier through a resistor, the output of said resistor voltage-division means is used as a second input of the amplifier, and the output of said current mirror circuit is used as an output of the amplifier.

5. An amplifier comprising:

a current mirror circuit;

third current generating means connected to an output of said current mirror circuit;

resistor voltage-division means connected to an input of said current mirror circuit;

second current generating means for supplying a current to a voltage-division output of said resistor voltage-division means; and first current generating means connected to the input of said current mirror circuit, wherein the output of said current mirror circuit is connected to a first input of said amplifier through an output of the current mirror circuit and a resistor, the output of said resistor voltage-division means is used as a second input of the amplifier, and the output of said current mirror circuit is used as an output of the amplifier.

6. An amplifier comprising:

a current mirror circuit;

first resistor voltage-division means connected to an input of said current mirror circuit;

first current generating means connected to the input of the current mirror circuit;

second resistor voltage-division means connected to an output of said current mirror circuit; and second current generating means connected to the output of the current mirror circuit, wherein the output of first resistor voltage-division means is used as a first input of said amplifier, the output of said second resistor voltage-division means is used as a second input of the amplifier, and the output of said current mirror circuit is used as an output of the amplifier.

7. An amplifier comprising:

a current mirror circuit;

resistor voltage-division means connected to an input of said current mirror circuit;

current generating means connected to an input of the current mirror circuit;

first and second voltage/current converting means having input terminals used as outputs of said resistor voltage-division means and having an output terminal used as an output of the current mirror circuit; and current comparing means for comparing currents at the output terminals of said first and second voltage/current converting means, wherein the input terminal of said first voltage/current converting means is used as a first input of said amplifier, the input terminal of said second voltage/current converting means is used as a second input of the amplifier, and an output of said current comparing means is used as an output of the amplifier.

8. An amplifier comprising:

a current mirror circuit;

first current generating means connected to an input of said current mirror circuit;

resistor voltage-division means connected to an output of said current mirror circuit; and second current generating means connected to the output of said current mirror circuit, wherein the input of said current mirror circuit is connected to a first input of said amplifier through a resistor, an output of said resistor voltage-division means is used as a second input of the amplifier, and the output of said current mirror circuit is used as an output of the amplifier.

9. An amplifier comprising:

a current mirror circuit;

second current generating means connected to an output of said current mirror circuit;

resistor voltage-division means connected to an input of said current mirror circuit; and first current generating means connected to the input of said current mirror circuit, wherein the output of said current mirror circuit is connected to a first input of said amplifier through a resistor, an output of said resistor voltage-division means is used as a second input of the amplifier, and the output of said current mirror circuit is used as an output of the amplifier.

10. An amplifier comprising:

a current mirror circuit;

first resistor voltage-division means connected to an input;

first current generating means for supplying a current to a voltage-division output of said first resistor voltage-division means;

second resistor voltage-division means connected to an output of said current mirror circuit; and second current generating means for supplying a current to a voltage-division output of said resistor voltage-division means, wherein the output of said first resistor voltage-division means is used as a first input of said amplifier, the output of said second resistor voltage-division means is used as a second input of the amplifier, and the output of said current mirror circuit is used as an output of the amplifier.

11. An amplifier comprising:

a current mirror circuit;

resistor voltage-division means connected to an input of said current mirror circuit;

current generating means for supplying a current to a voltage-division output of said resistor voltage-division means;

first and second voltage/current converting means having output terminals used as outputs of said current mirror circuit and also having an output terminal used as an output of said current mirror circuit; and current comparing means for comparing currents at the output terminals of said first and second voltage/current converting means, wherein the input terminal of said first voltage/current converting means is used as a first input of said amplifier, the input terminal of said second voltage/current converting means is used as a second input of the amplifier, and an output of said current comparing means is used an an output of the amplifier.

12. An amplifier comprising:

a current mirror circuit;

resistor voltage-division means connected to an output of said current mirror circuit; and current generating means for supplying a current to a voltage-division output of said resistor voltage-division means, an input of said current mirror circuit is connected to a first input of said amplifier through a resistor, the output of said resistor voltage-division means is used as a second input of the amplifier, and the output of said current mirror circuit is used as an output of the amplifier.

13. An amplifier comprising:

a current mirror circuit;

resistor voltage-division means connected to an input of said current mirror circuit; and current generating means for supplying a current to a voltage-division output of said resistor voltage-division means, wherein an output of said current mirror circuit is connected to a first input of said amplifier through a resistor, the output of said resistor voltage-division means is used as a second input of the amplifier, and the output of the current mirror circuit is used as an output of the amplifier.

14. An amplifier as set forth in claim 1, wherein said current mirror circuit comprises bipolar transistors, and said current generating means controls its current value to have a magnitude proportional to absolute temperature and inversely proportional to a current setting resistance.

15. An amplifier as set forth in claim 1, wherein a current setting resistor for setting a current value of said current generating means and a resistor associated with the input terminal of said amplifier and with the input of said current mirror have an identical temperature coefficient.

16. An amplifier as set forth in claim 2, wherein said current mirror circuit comprises bipolar transistors, and each of said first and third current generating means controls its current value to have a magnitude proportional to absolute temperature and inversely proportional to a current setting resistance.

17. An amplifier as set forth in claim 2, wherein a temperature coefficient of a current setting resistance for setting a current value of said first current generating means is set to be equal to a temperature coefficient of a resistance of said first resistor voltage-division means, and a temperature coefficient of a current setting resistance for setting a current value of said third current generating means is set to be equal to a temperature coefficient of a resistance of said second resistor voltage-division means.

18. An amplifier as set forth in claim 3, wherein said current mirror circuit comprises bipolar transistors, and said first current generating means controls its current value to have a magnitude proportional to absolute temperature and inversely proportional to a current setting resistance.

19. An amplifier as set forth in claim 3, wherein a temperature coefficient of a current setting resistance for setting a current value of said first current generating means is set to be equal to a temperature coefficient of a resistance of said resistor voltage-division means.

20. An amplifier as set forth in claim 4, wherein said current mirror circuit comprises bipolar transistors, and said second current generating means controls its current value to have a magnitude proportional to absolute temperature and inversely proportional to a current setting resistance.

21. An amplifier as set forth in claim 5, wherein said current mirror circuit comprises bipolar transistors, and said second current generating means controls its current value to have a magnitude proportional to absolute temperature and inversely proportional to a current setting resistance.

22. An amplifier as set forth in claim 4, wherein a temperature coefficient of a current setting resistance for setting a current value of said second current generating means is set to be equal to an temperature coefficient of a resistance of said resistor voltage-division means.

23. An amplifier as set forth in claim 5, wherein a temperature coefficient of a current setting resistance for setting a current value of said second current generating means is set to be equal to an temperature coefficient of a resistance of said resistor voltage-division means.

24. An amplifier as set forth in claim 10, wherein said current mirror circuit comprises bipolar transistors, and each of said first and second current generating means controls its current value to have a magnitude proportional to absolute temperature and inversely proportional to a current setting resistance.

25. An amplifier as set forth in claim 10, wherein a temperature coefficient of a current setting resistance for setting a current value of said first current generating means is set to be equal to a temperature coefficient of a resistance of said first resistor voltage-division means, and a temperature coefficient of a current setting resistance for setting a current value of said second current generating means is set to be equal to a temperature coefficient of a resistance of said second resistor voltage-division means.

26. An amplifier as set forth in claim 11, wherein said current mirror circuit comprises bipolar transistors, and said current generating means controls its current value to have a magnitude proportional to absolute temperature and inversely proportional to a current setting resistance.

27. An amplifier as set forth in claim 12, wherein said current mirror circuit comprises bipolar transistors, and said current generating means controls its current value to have a magnitude proportional to absolute temperature and inversely proportional to a current setting resistance.

28. An amplifier as set forth in claim 13, wherein said current mirror circuit comprises bipolar transistors, and said current generating means controls its current value to have a magnitude proportional to absolute temperature and inversely proportional to a current setting resistance.

29. An amplifier as set forth in claim 11, wherein a temperature coefficient of a current setting resistance for setting a current value of said current generating means is set to be equal to a temperature coefficient of a resistance of said resistor voltage-division means.

30. An amplifier as set forth in claim 12, wherein a temperature coefficient of a current setting resistance for setting a current value of said current generating means is set to be equal to a temperature coefficient of a resistance of said resistor voltage-division means.

31. An amplifier as set forth in claim 13, wherein a temperature coefficient of a current setting resistance for setting a current value of said current generating means is set to be equal to a temperature coefficient of a resistance of said resistor voltage-division means.

32. An amplifier as set forth in claim 1, further comprising means for discharging from the output terminal of said current mirror circuit the same current as a component of a current received from the input terminal of the current mirror circuit, which component is used to drive the current mirror circuit.

33. An amplifier as set forth in claim 1, further comprising a transistor having a base connected to the output terminal of said current mirror circuit and also comprising current generating means connected to a collector of said transistor, and wherein a base current of said transistor is equal to a sum of base currents of bipolar transistors of said current mirror circuit and a collector of said transistor is used as the output terminal of said amplifier.

34. An amplifier as set forth in claim 2, further comprising means for discharging from the output of said current mirror circuit the same current as a component of a current receiving from the input of the current mirror circuit which component is used to drive the current mirror circuit.

35. An amplifier as set forth in claim 3, further comprising means for discharging from the output of said current mirror circuit the same current as a component of a current receiving from the input of the current mirror circuit which component is used to drive the current mirror circuit.

36. An amplifier as set forth in claim 4, further comprising means for discharging from the output of said current mirror circuit the same current as a component of a current receiving from the input of the current mirror circuit which component is used to drive the current mirror circuit.

37. An amplifier as set forth in claim 5, further comprising means for discharging from the output of said current mirror circuit the same current as a component of a current receiving from the input of the current mirror circuit which component is used to drive the current mirror circuit.

38. An amplifier as set forth in claim 6, further comprising means for discharging from the output of said current mirror circuit the same current as a component of a current receiving from the input of the current mirror circuit which component is used to drive the current mirror circuit.

39. An amplifier as set forth in claim 7, further comprising means for discharging from the output of said current mirror circuit the same current as a component of a current receiving from the input of the current mirror circuit which component is used to drive the current mirror circuit.

40. An amplifier as set forth in claim 8, further comprising means for discharging from the output of said current mirror circuit the same current as a component of a current receiving from the input of the current mirror circuit which component is used to drive the current mirror circuit.

41. An amplifier as set forth in claim 9, further comprising means for discharging from the output of said current mirror circuit the same current as a component of a current receiving from the input of the current mirror circuit which component is used to drive the current mirror circuit.

42. An amplifier as set forth in claim 10, further comprising means for discharging from the output of said current mirror circuit the same current as a component of a current receiving from the input of the current mirror circuit which component is used to drive the current mirror circuit.

43. An amplifier as set forth in claim 11, further comprising means for discharging from the output of said current mirror circuit the same current as a component of a current receiving from the input of the current mirror circuit which component is used to drive the current mirror circuit.

44. An amplifier as set forth in claim 12, further comprising means for discharging from the output of said current mirror circuit the same current as a component of a current receiving from the input of the current mirror circuit which component is used to drive the current mirror circuit.

45. An amplifier as set forth in claim 13, further comprising means for discharging from the output of said current mirror circuit the same current as a component of a current receiving from the input of the current mirror circuit which component is used to drive the current mirror circuit.

46. An amplifier as set forth in claim 2, further comprising a transistor having a base connected to the output of said current mirror circuit and also comprising current generating means connected to a collector of said transistor, and wherein a base current of said transistor is equal to a sum of base currents of said bipolar transistors of said current mirror circuit and a collector of said transistor is used as the output of said amplifier.

47. An amplifier as set forth in claim 3, further comprising a transistor having a base connected to the output of said current mirror circuit and also comprising current generating means connected to a collector of said transistor, and wherein a base current of said transistor is equal to a sum of base currents of said bipolar transistors of said current mirror circuit and a collector of said transistor is used as the output of said amplifier.

48. An amplifier as set forth in claim 4, further comprising a transistor having a base connected to the output of said current mirror circuit and also comprising current generating means connected to a collector of said transistor, and wherein a base current of said transistor is equal to a sum of base currents of said bipolar transistors of said current mirror circuit and a collector of said transistor is used as the output of said amplifier.

49. An amplifier as set forth in claim 5, further comprising a transistor having a base connected to the output of said current mirror circuit and also comprising current generating means connected to a collector of said transistor, and wherein a base current of said transistor is equal to a sum of base currents of said bipolar trnasistors of said current mirror circuit and a collector of said transistor is used as the output of said amplifier.

50. An amplifier as set forth in claim 6, further comprising a transistor having a base connected to the output of said current mirror circuit and also comprising current generating means connected to a collector of said transistor, and wherein a base current of said transistor is equal to a sum of base currents of said bipolar transistors of said current mirror circuit and a collector of said transistor is used as the output of aid amplifier.

51. An amplifier as set forth in claim 7, further comprising a transistor having a base connected to the output of said current mirror circuit and also comprising current generating means connected to a collector of aid transistor, and wherein a base current of said transistor is equal to a sum of base currents of said bipolar transistors of said current mirror circuit and a collector of said transistor is used as the output of said amplifier.

52. An amplifier as set forth in claim 8, further comprising a transistor having a base connected to the output of said current mirror circuit and also comprising current generating means connected to a collector of said transistor, and wherein a base current of said transistor is equal to a sum of base currents of said bipolar transistors of said current mirror circuit and a collector of said transistor is used as the output of said amplifier.

53. An amplifier a set forth in claim 9, further comprising a transistor having a base connected to the output of said current mirror circuit and also comprising current generating means connected to a collector of said transistor, and wherein a base current of said transistor is equal to a sum of base currents of said bipolar transistors of said current mirror circuit and a collector of said transistor is used as the output of said amplifier.

54. An amplifier as set forth in claim 10, further comprising a transistor having a base connected to the output of said current mirror circuit and also comprising current generating means connected to a collector of said transistor, and wherein a base current of said transistor is equal to a sum of base currents of said bipolar transistors of said current mirror circuit and a collector of said transistors is used as the output of said amplifier.

55. An amplifier a set forth in claim 11, further comprising a transistor having a base connected to the output of said current mirror circuit and also comprising current generating means connected to a collector of said transistor, and wherein a base current of said transistor is equal to a sum of base currents of said bipolar transistors of said current mirror circuit and a collector of said transistor is used as the output of said amplifier.

56. An amplifier a set forth in claim 12, further comprising a transistor having a base connected to the output of said current mirror circuit and also comprising current generating means connected to a collector of said transistor, and wherein a base current of aid transistor is equal to a sum of base currents of said bipolar transistors of said current mirror circuit and a collector of said transistor is used as the output of said amplifier.

57. An amplifier as set forth in claim 13, further comprising a transistor having a base connected to the output of said current mirror circuit and also comprising current generating means connected to a collector of said transistor, and wherein a base current of said transistor is equal to a sum of base currents of aid bipolar transistors of said current mirror circuit and a collector of said transistor is used as the output of said amplifier.

58. An amplifier according to claim 1, wherein said current generating means comprises a band-gap current source.

* * * * *